United States Patent
Chen

(10) Patent No.: US 11,610,818 B2
(45) Date of Patent: Mar. 21, 2023

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventor: Chien-Hao Chen, Ilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 30 days.

(21) Appl. No.: 17/161,036

(22) Filed: Jan. 28, 2021

(65) Prior Publication Data

US 2022/0238381 A1   Jul. 28, 2022

(51) Int. Cl.
*H01L 21/8234* (2006.01)
*H01L 29/51* (2006.01)
*H01L 27/088* (2006.01)

(52) U.S. Cl.
CPC ............ *H01L 21/82345* (2013.01); *H01L 21/823431* (2013.01); *H01L 21/823462* (2013.01); *H01L 27/0886* (2013.01); *H01L 29/517* (2013.01)

(58) Field of Classification Search
CPC ....... H01L 21/82345; H01L 21/823431; H01L 21/823462; H01L 27/0886; H01L 29/517
See application file for complete search history.

(56) References Cited

U.S. PATENT DOCUMENTS

| 2006/0264020 | A1* | 11/2006 | Lazovsky | H01L 21/76849 |
| | | | | 438/597 |
| 2014/0113443 | A1* | 4/2014 | Won | H01L 29/513 |
| | | | | 438/591 |
| 2017/0213826 | A1* | 7/2017 | Kim | H01L 29/7854 |
| 2018/0122806 | A1* | 5/2018 | Li | H01L 21/823842 |
| 2018/0166274 | A1* | 6/2018 | Lin | H01L 21/02326 |
| 2018/0226300 | A1* | 8/2018 | Song | H01L 27/0605 |

* cited by examiner

*Primary Examiner* — Christine A Enad
(74) *Attorney, Agent, or Firm* — WPAT Law; Anthony King

(57) ABSTRACT

A semiconductor structure includes a first metal gate structure and a second metal gate structure. The first metal gate structure includes a first high-k gate dielectric layer, a first work function metal layer over the first high-k gate dielectric layer, and a first intervening layer between the first high-k gate dielectric layer and the first work function metal layer. The second metal gate structure includes a second high-k gate dielectric layer and a second work function metal layer over the second high-k gate dielectric layer. The first work function metal layer and the second work function metal layer include a same material. A thickness of the first work function metal layer is less than a thickness of the second work function metal layer.

20 Claims, 18 Drawing Sheets

SEMICONDUCTOR STRUCTURE AND METHOD FOR FORMING THE SAME

BACKGROUND

The electronics industry has experienced an ever increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far these goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices required similar advances in semiconductor manufacturing processes and technology.

As technology nodes achieve progressively smaller scales, in some IC designs, researchers have hoped to replace a typical polysilicon gate with a metal gate to improve device performance by decreasing feature sizes. One approach of forming the metal gate is called a "gate-last" approach, sometimes referred to as replacement polysilicon gate (RPG) approach. In the RPG approach, the metal gate is fabricated last, which allows for a reduced number of subsequent operations.

Further, as the dimensions of a transistor decrease, the thickness of the gate dielectric layer may be reduced to maintain performance with a decreased gate length. In order to reduce gate leakage, a high dielectric constant (high-k or HK) gate dielectric layer is used to provide a thickness as effective as that provided by a typical gate oxide used in larger technology nodes. A high-k metal gate (HKMG) approach including the metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
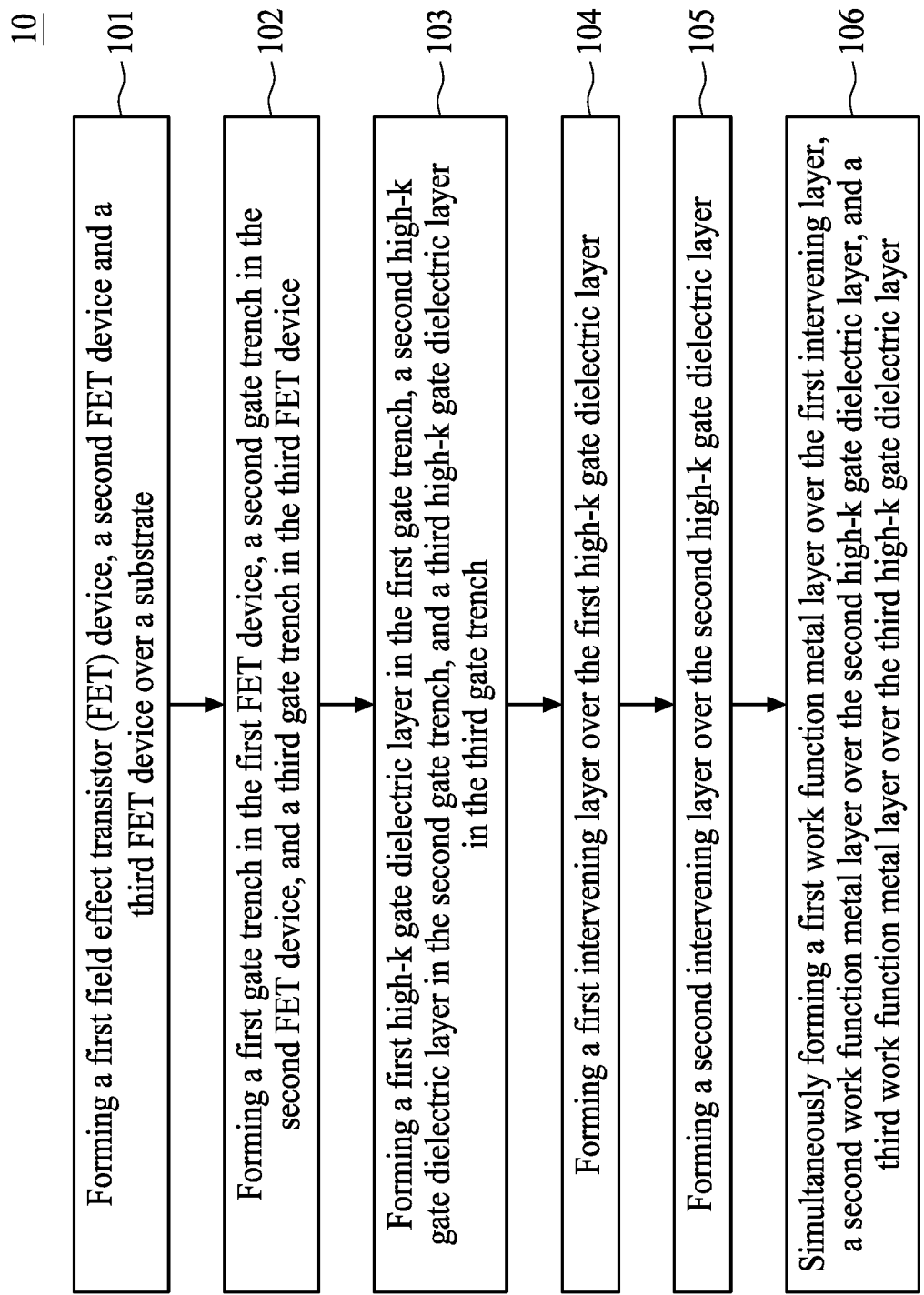
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With the ongoing down-scaling of integrated circuits, power supply voltages of the circuits may be reduced. However, the voltage reduction may be different in different circuits or regions. For example, threshold voltage (Vt) requirements may be different between the memory circuits and the core circuits. A multiple-Vt capability is therefore required for device design.

Further, as the gate length (Lg) scale is reduced in advanced nodes, to realize the multiple-Vt design using different gate metal materials becomes challenging due to the limited Lg and the gap-filling ability requirements.

Embodiments of a method for forming a semiconductor structure are therefore provided. The semiconductor structure is formed in an HKMG process in accordance with the embodiments. The semiconductor structure can be formed in a planar device process according to some embodiments. The semiconductor structure can be formed in a non-planar device in alternative embodiments. In some embodiments, the method for forming the semiconductor structure includes provides intervening layers with different interference abilities for overlaying layer growth. In some embodiments, the overlaying layers, such as a work function metal layer, may include aluminum. The work function metal layers obtain different thicknesses due to the intervening layers. For example, a thinner work function metal layer is formed on the intervening layer with greater interference ability, and thicker work function metal layer is formed on the intervening layer with less interference ability. The thinner work function metal layer may include aluminum less than that of the thicker work function metal layer. The thinner work function metal layer is suitable for higher-voltage devices because it provides less aluminum, and the thicker work function metal layer is suitable for low-voltage devices because it provides more aluminum. Accordingly, the method provides intervening layers with different interference abilities for work function layer growth, and provides the work function metal layers with different Al amounts and thicknesses to meet multiple-Vt structure requirements and gap-filling requirements.

FIG. 1 is a flowchart representing a method for forming a semiconductor structure 10 according to aspects of the present disclosure. The method 10 includes a number of operations (101, 102, 103, 104, 105, and 106). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may just be briefly described herein. Thus, other implementations are possible within the scope of the various aspects described herein.

Figure 2:
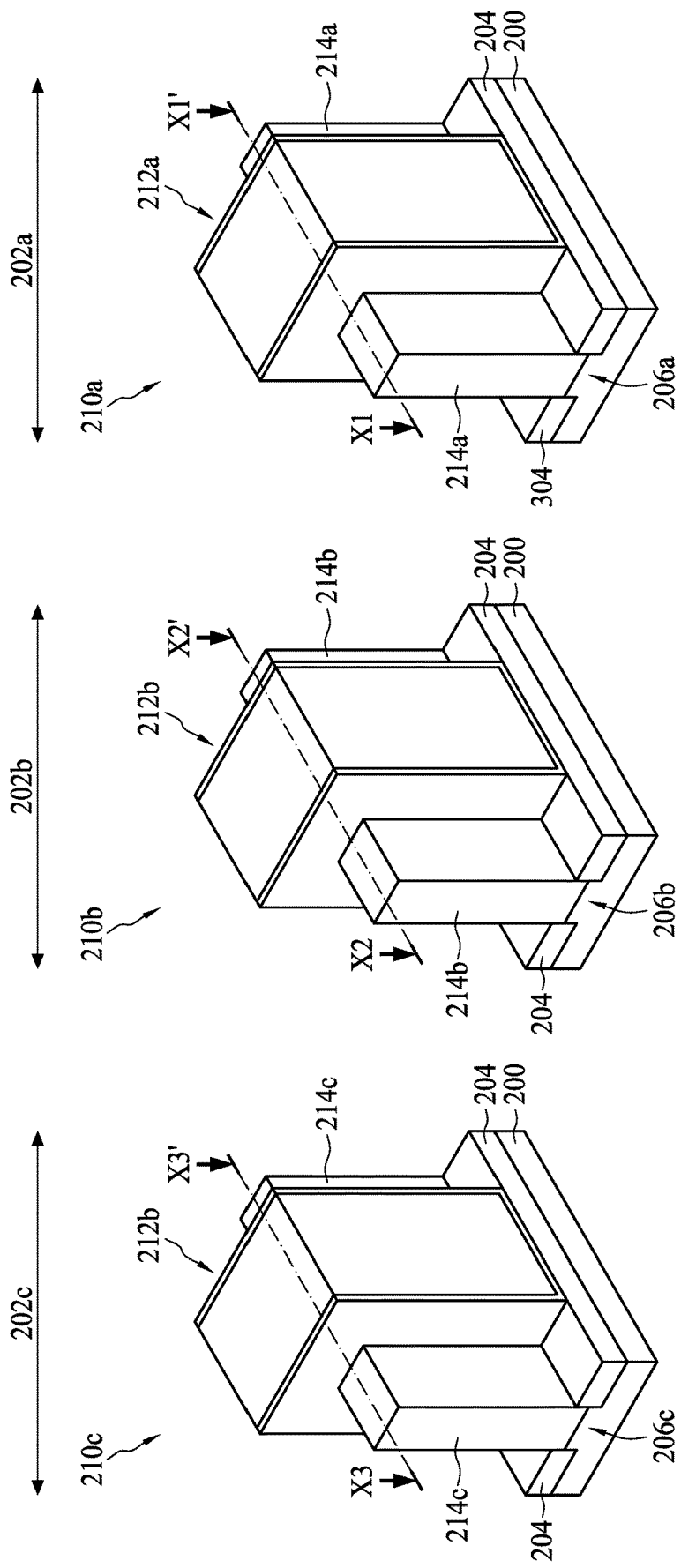
FIG. 2 shows perspective views illustrating portions of a semiconductor structure at a fabrication stage according to aspects of the present disclosure in one or more embodiments.

FIG. 2 shows perspective views illustrating portions of a semiconductor structure according to aspects of the present disclosure. In some embodiments, in operation 101, the method 10 include forming a first FET device 210a, a second FET device 210b and a third FET device 210c over a substrate 200. In some embodiments, the substrate 200 may be a semiconductor substrate such as a silicon substrate. The substrate 200 may also include other semiconductors such as germanium (Ge), silicon carbide (SiC), silicon germanium (SiGe), or diamond. Alternatively, the substrate 200 may include a compound semiconductor and/or an alloy semiconductor. The substrate 200 may include various layers, including conductive or insulating layers formed on a semiconductor substrate. The substrate 200 may include various doping configurations depending on design requirements, as is known in the art. For example, different doping profiles (e.g., n wells or p wells) may be formed on the substrate 200 in regions designed for different device types (e.g., n-type field-effect transistors (NFET), or p-type field-effect transistors (PFET)). The suitable doping may include ion implantation of dopants and/or diffusion processes.

In some embodiments, the substrate 200 may include a first region 202a, a second region 202b and a third region 202c. Further, the substrate 200 may include isolation structures, e.g., shallow trench isolation (STI) structures 204 interposing the first, second and third regions 202a, 202b and 202c. The regions 202a, 202b and 202c are defined for accommodating different devices. For example, the first region 202a may accommodate a high voltage (HV) device, the second region 202b may accommodate a middle voltage (MV) device, and the third region 202c may accommodate a low voltage (LV) device. In some embodiments, the HV device used herein is a device having an operating voltage greater than that of the LV device, and the MV device is a device have an operating voltage between those of the HV device and the LV device. It should be noted that the operating voltages can vary for different applications, thus they are not limited herein. Additionally, the region arrangement is not limited by FIGS. 2 to 13.

In some embodiments, the devices 210a, 210b and 210c may be planar transistors or multi-gate transistors, such as fin-like FETs (FinFETs).

In some embodiments, in operation 101, the first FET device 210a is formed in the first region 202a. In some embodiments, the first FET device 210a may be an HV device. In some embodiments, the first FET device 210a may an n-type HV device, but the disclosure is not limited thereto. The first FET device 210a may include a first gate structure 212a and a first source/drain 214a. In some embodiments, the first FET device 210a may be a first FinFET device, and a first fin structure 206a is disposed over the substrate 200, as shown in FIG. 2. A portion of the first fin structure 206a covered by the first gate structure 212a serves as a channel region, and portions of the first fin structure 206a exposed through the first gate structure 212a serve as the first source/drain 214a.

In operation 101, the second FET device 210b is formed in the second region 202b. In some embodiments, the second FET device 210b may be an MV device. In some embodiments, the second FET device 210a may be an n-type MV device, but the disclosure is not limited thereto. The second FET device 210b may include a second gate structure 212b and a second source/drain 214b. In some embodiments, the second FET device 210b is a second FinFET device, and a second fin structure 206b is disposed over the substrate 200, as shown in FIG. 2. Similar to the first FET device 210a described above, in the second FET device 210b, a portion of the second fin structure 206b covered by the second gate structure 212b serves as a channel region, and portions of the second fin structure 206b exposed through the second gate structure 212b serve as the second source/drain 214b.

In operation 101, the third FET device 210c is formed in the third region 202c. In some embodiments, the first FET device 210a may be an LV device. In some embodiments, the third FET device 210c may an n-type LV device, but the disclosure is not limited thereto. The third FET device 210c may include a third gate structure 212c and a third source/drain 214c. In some embodiments, the third FET device 210c may be a third FinFET device, and a third fin structure 206c is disposed over the substrate 200, as shown in FIG. 2. A portion of the third fin structure 206c covered by the third gate structure 212c serves as a channel region, and portions of the third fin structure 206c exposed through the third gate structure 212c serve as the third source/drain 214c.

In some embodiments, the first gate structure 212a, the second gate structure 212b and the third gate structure 212c are sacrificial gate structures. The sacrificial gate structures may respectively include a dielectric layer and a sacrificial semiconductor layer. In some embodiments, the semiconductor layers are made of polysilicon, but the disclosure is not limited thereto. In some embodiments, spacers 216 (shown in FIG. 3) can be formed over sidewalls of the sacrificial gate structures 212a, 212b and 212c. In some embodiments, the spacers 216 are made of silicon nitride (SiN), silicon carbide (SiC), silicon oxide (SiO), silicon oxynitride (SiON), silicon carbide or any other suitable material, but the disclosure is not limited thereto. In some embodiments, the spacers 216 are formed by deposition and etch back operations.

As shown in FIG. 2, in some embodiments, the first source/drain 214a is formed over the first fin structure 206a at two opposite sides of the first gate structure 212a. Similarly, the second source/drain 214b is formed over the second fin structure 206b at two opposite sides of the second gate structure 212b, and the third source/drain 214c is formed over the third fin structure 206c at two opposite sides of the third gate structure 212c. In some embodiments, heights of the first source/drain 214a, the second source/drain 214b and the third source/drain 214c may be greater than heights of the first fin structure 206a, the second fin structure 206b and the third fin structure 206c, respectively. In some embodiments, the sources/drains 214a, 214b, 214c may be formed by forming recesses in the fin structures 206a, 206b, 206c and growing a strained material in the recesses by an epitaxial (epi) process. In addition, the lattice constant of the strained material may be different from the lattice constant of the fin structures 206a, 206b, 206c. Accordingly, the first, second and third source/drain 214a, 214b and 214c may serve as stressors that improve carrier mobility. In some embodiments, the first source/drain 214a, the second source/drain 214b and the third source/drain 214c may include n-type dopants. However, a dopant concentration of the first source/drain 214a, a dopant concentration of the second source/drain 214b, and a dopant concentration of the third source/drain 214c may be different from each other, but the disclosure is not limited thereto.

Figure 3:
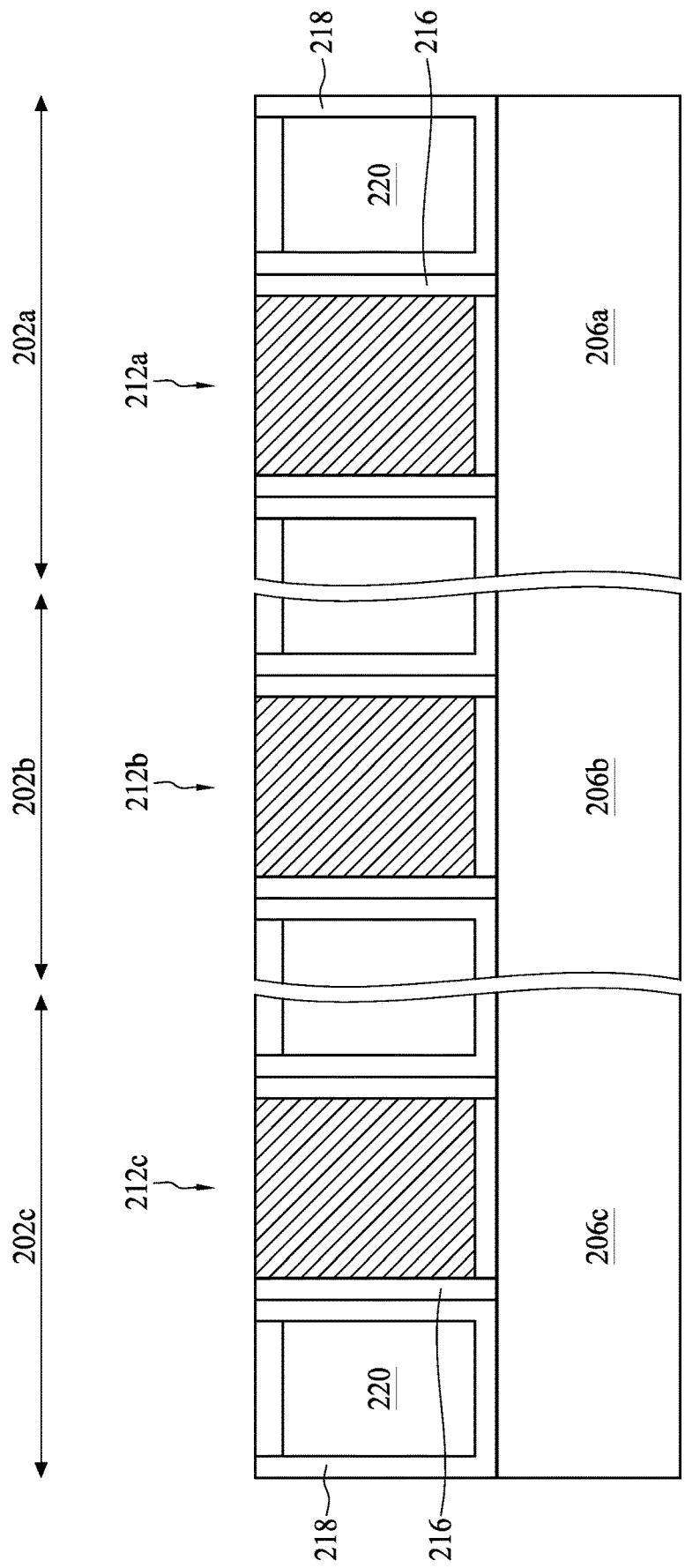
FIG. 3 shows cross-sectional views taken along lines X1-X1', X2-X2' and X3-X3' of FIG. 2, respectively.

In some embodiments, after the forming of the sources/drains 214a, 214b and 214c, a contact etch stop layer (CESL) 218 may be formed to cover the FinFET devices 210a, 210b and 210c over the substrate 200. In some embodiments, the CESL 218 can include silicon nitride, silicon oxynitride, and/or other applicable materials. Subsequently, an inter-layer dielectric (ILD) structure 220 may be formed on the CESL 218 in accordance with some embodiments. The ILD structure 220 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), or polyimide. Next, a polishing process is performed on the ILD structure 220 and the CESL 218 to expose top surfaces of the gate structures 212a, 212b and 212c, as shown in FIG. 3. In some embodiments, the ILD structure 220 and the CESL 218 are planarized by a chemical mechanical polishing (CMP) process until the top surfaces of the gate structures 212a, 212b and 212c are exposed. Consequently, the ILD structure 220 surrounds the gate structures 212a, 212b, 212c and the fin structures 206a, 206b, 206c. In other words, the fin structures 206a, 206b, 206c and the sacrificial gate structures 212a, 212b, 212c are embedded in the ILD structure 220, while a top surface of the sacrificial gate structures 212a, 212b, 212c remains exposed, as shown in FIG. 3.

Figure 4:
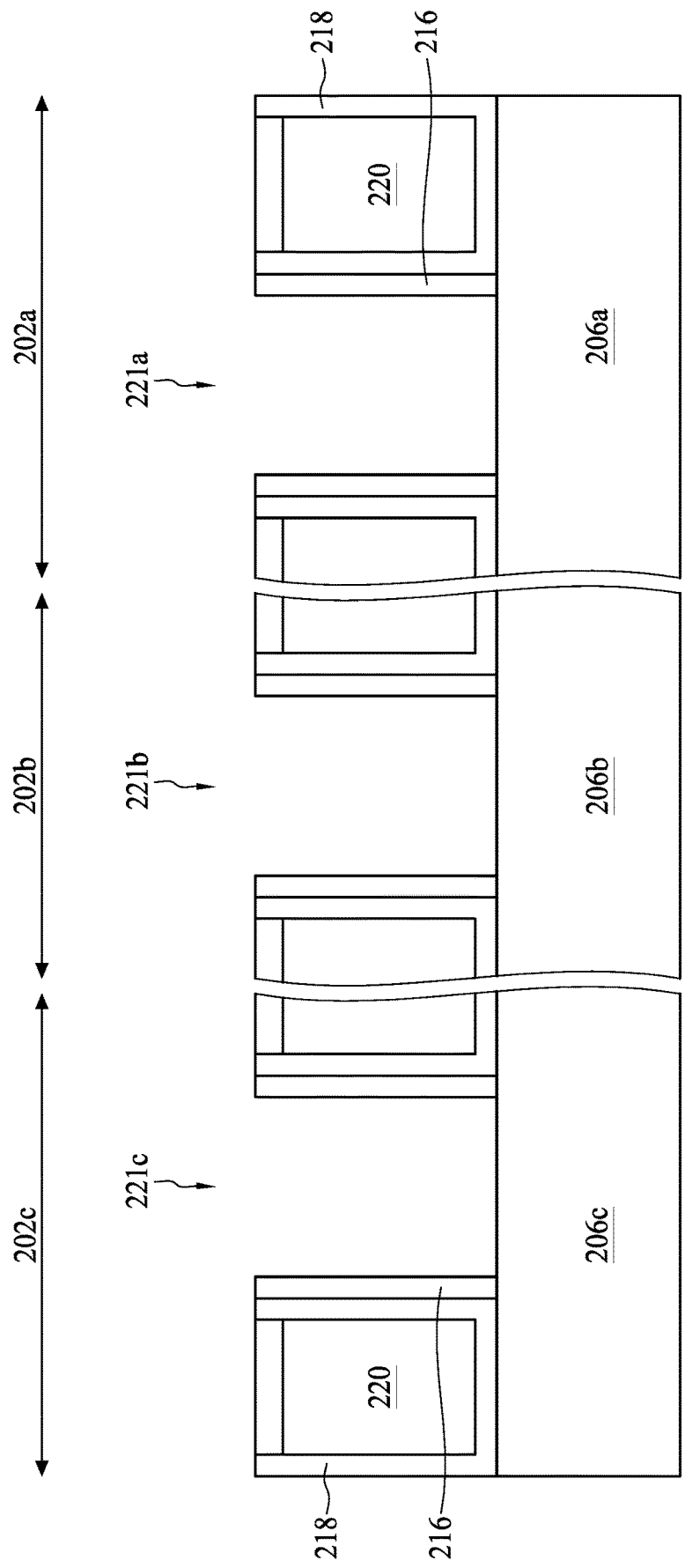
FIGS. 4 to 13 are schematic drawings illustrating the semiconductor structure at various fabrication stages subsequent the stages shown in FIG. 3 according to aspects of the present disclosure in one or more embodiments.

Referring to FIG. 4, in some embodiments, in operation 102, the method 10 includes forming a first gate trench 221a in the first FET device 210a, a second gate trench 221b in the second FET device 210b, and a third gate trench 221c in the third FET device 210c. In some embodiments, the sacrificial semiconductor layer is removed. In some embodiments, the dielectric layer may be removed for forming an interfacial layer (IL). In some embodiments, the dielectric layer may be left in the gate trench, though not shown. It should be noted that the removal of the dielectric layer may be performed depending on different process or product requirements. Accordingly, the first fin structure 206a may be exposed through the first gate trench 221a, the second fin structure 206b may be exposed through the second gate trench 221b, and the third fin structure 206c nay be exposed through the third gate trench 221c, as shown in FIG. 4. Additionally, in some embodiments, a protecting cap may be formed over the ILD structure 220. The protecting cap may include a material different from that of the ILD structure 220. The protecting cap protects the ILD structure 220 during the removing of the sacrificial semiconductor layer and other subsequent operations.

Figure 5:
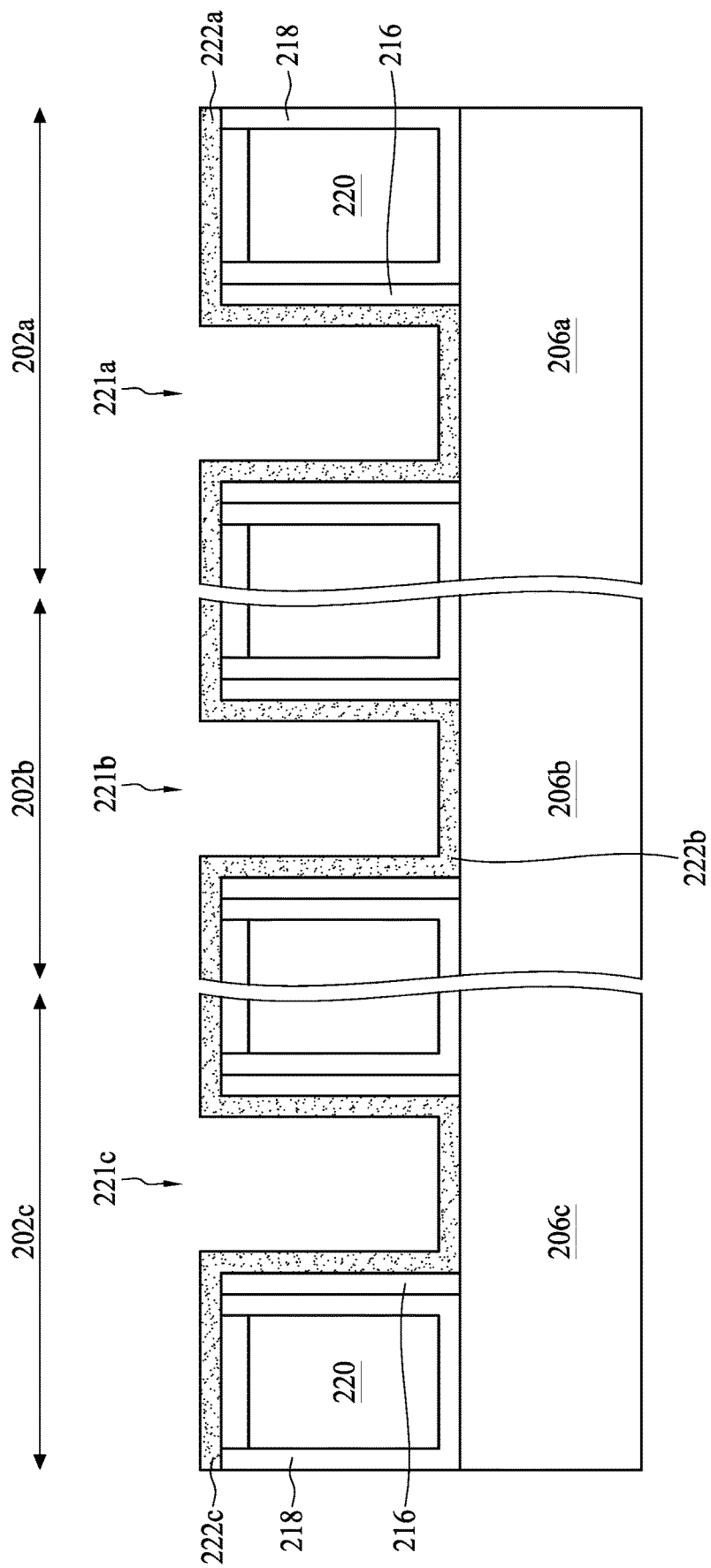

Referring to FIG. 5, in some embodiments, in operation 103, the method 10 includes forming a first high-k gate dielectric layer 222a in the first gate trench 221a, a second high-k gate dielectric layer 222b in the second gate trench 221b, and a third high-k gate dielectric layer 222c in the third gate trench 221c. A thickness of the first high-k gate dielectric layer 222a, a thickness of the second high-k gate dielectric layer 222b and a thickness of the third high-k gate dielectric layer 222c may be similar. In some embodiments, the thicknesses of the first, second and third high-k gate dielectric layers 222a, 222b and 222c may be between approximately 1 nanometer and approximately 3 nanometers, but the disclosure is not limited thereto. In some embodiments, an IL layer may be formed prior to the forming of the high-k gate dielectric layers 222a, 222b and 222c, though not shown. The IL layer may include an oxide-containing material such as SiO or SiON. In some embodiments, the IL layer covers portions of the fin structures 206a, 206b, 206c exposed in the gate trenches 221a, 221b, 221c. The first, second and third high-k gate dielectric layers 222a, 222b and 222c may be simultaneously formed on the IL layer. In some embodiments, the first, second and third high-k gate dielectric layers 222a, 222b and 222c may be conformally formed in the gate trenches 221a, 221b and 221c. Accordingly, the first high-k gate dielectric layer 222a covers at least sidewalls of the first gate trench 221a, the second high-k gate dielectric layer 222b covers at least sidewalls of the second gate trench 221b, and the third high-k gate dielectric layer 222c covers at least sidewalls of the second gate trench 221c. A thickness of the first high-k gate dielectric layer 222a, a thickness of the second high-k gate dielectric layer 222b and a thickness of the third high-k gate dielectric layer 222c are similar. In some embodiments, the high-k gate dielectric layers 222a, 222b and 222c include a same high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof.

Figure 6:
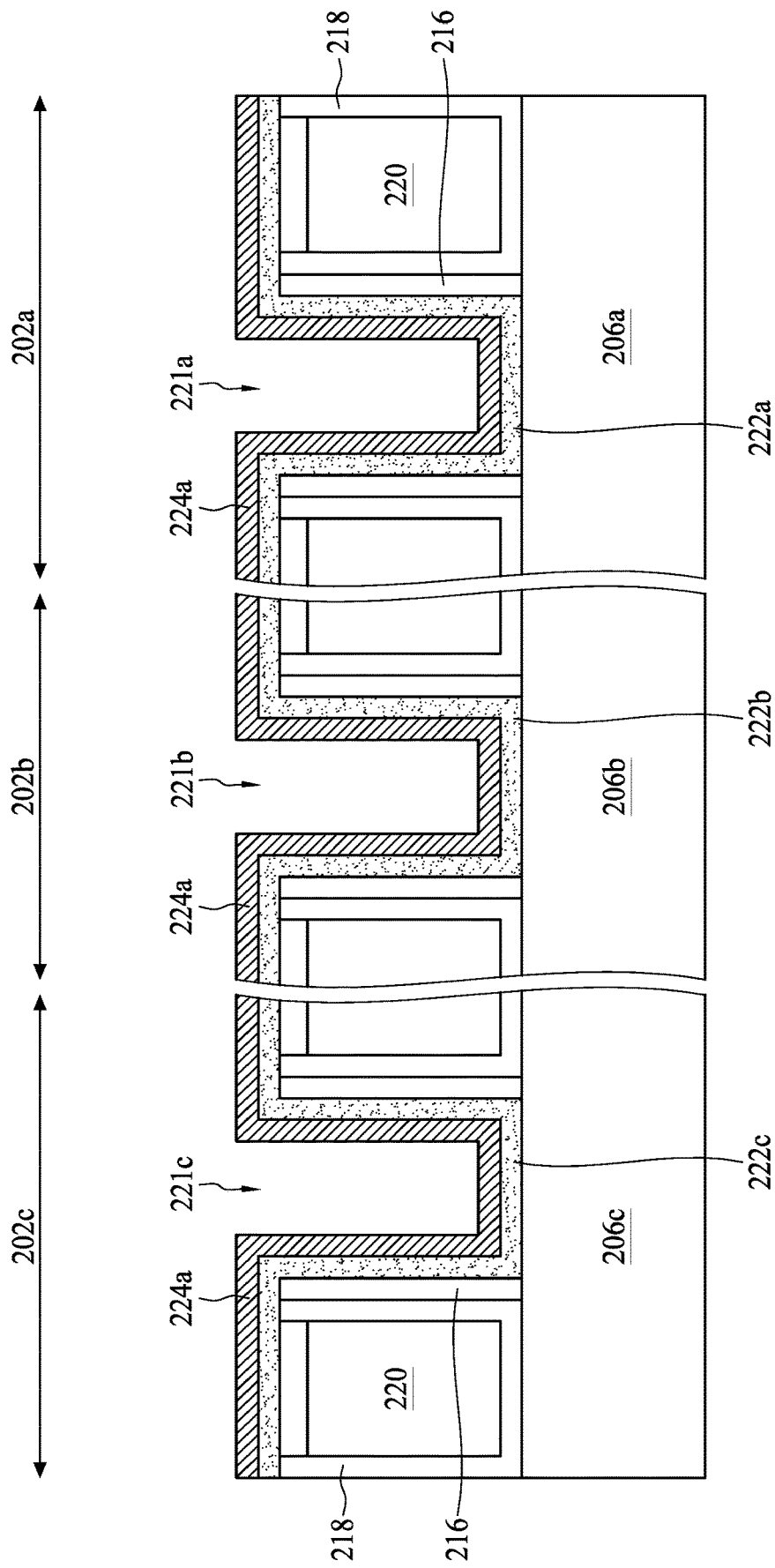
Figure 7:
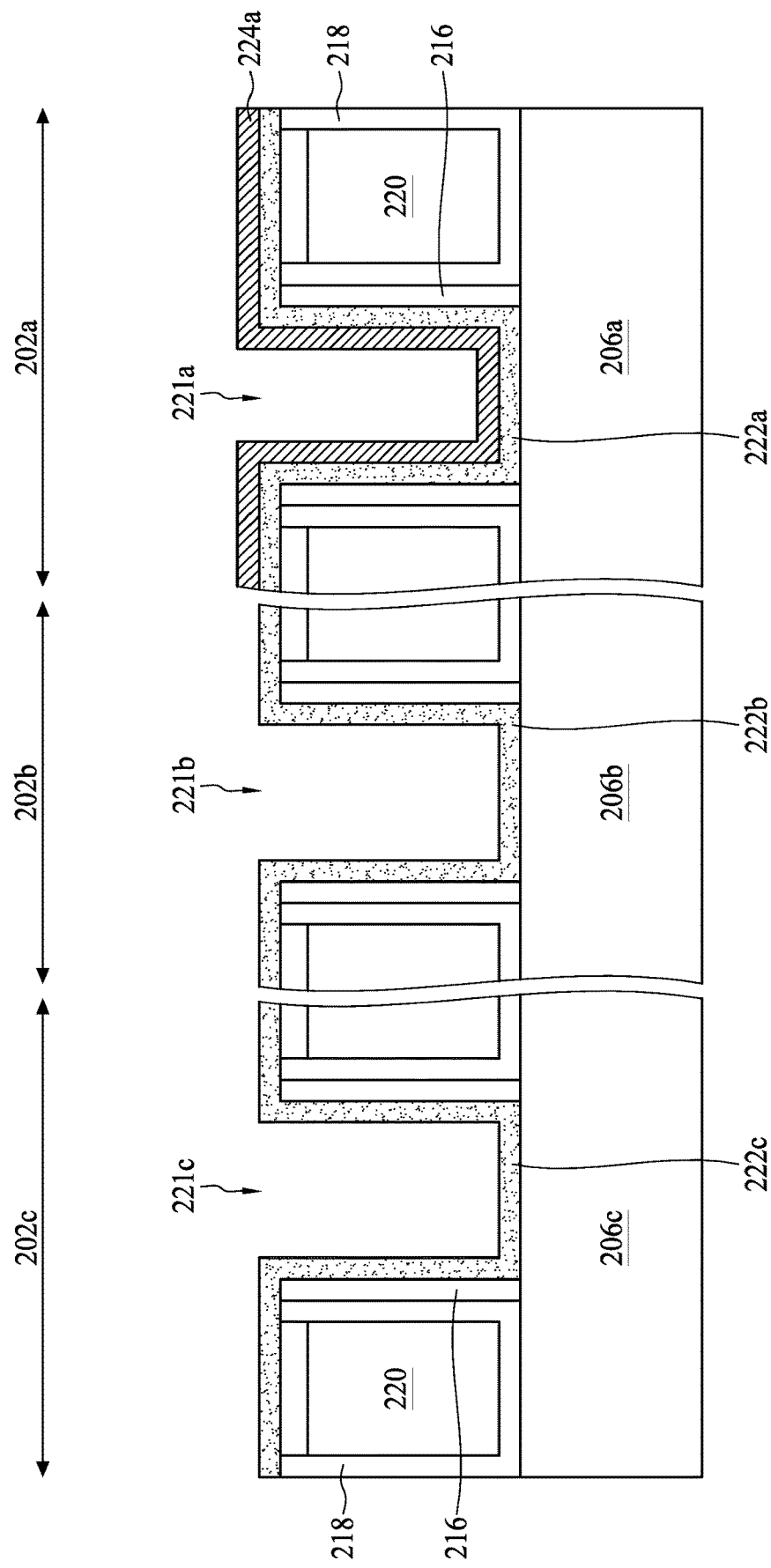

Referring to FIGS. 6 and 7, in some embodiments, in operation 104, the method 10 includes forming a first intervening layer 224a over the first high-k gate dielectric layer 222a. In some embodiments, the first intervening layer 224a may include silicon (Si), titanium (Ti), titanium nitride (TiN), tantalum (Ta), tantalum nitride (TaN), or a combination thereof. In some embodiments, a Ti concentration, Ta concentration or a Si concentration in the first intervening layer 224b may be between approximately 5% and approximately 60%, but the disclosure is not limited thereto. A thickness of the first intervening layer 224a may be between approximately 1 nanometer and approximately 10 nanometers, but the disclosure is not limited thereto. In some alternative embodiments, the thickness of the first intervening layer 224a may be less than approximately 1 nanometer. In some embodiments, the first intervening layer 224a may be formed by a chemical vapor deposition (CVD), an atomic layer deposition (ALD), or other suitable methods. In some embodiments, a process temperature for forming the first intervening layer 224a may be between approximately 100° C. and approximately 500° C., but the disclosure not limited thereto. Referring to FIG. 6, in some embodiments, operation 104 further includes forming the first intervening layer 224a conformally over the substrate 200. Therefore, the first intervening layer 224a may cover sidewalls and bottoms of the gate trenches 221a, 221b, 221c and top surfaces of the ILD structure 220, as shown in FIG. 6.

Referring to FIG. 7, operation 104 further includes removing portions of the first intervening layer 224a. In some embodiments, a patterned masking layer or a patterned protecting layer (not shown) may be formed over the first region 202a, and suitable etching operation(s) may be used to remove portions of the first intervening layer 224a exposed through the patterned masking layer. Consequently, the portions of the first intervening layer 224a are removed from the second gate trench 221b and the third gate trench 221c. In other words, the first intervening layer 224a remains in the first gate trench 221a and the first region 202a.

Figure 8:
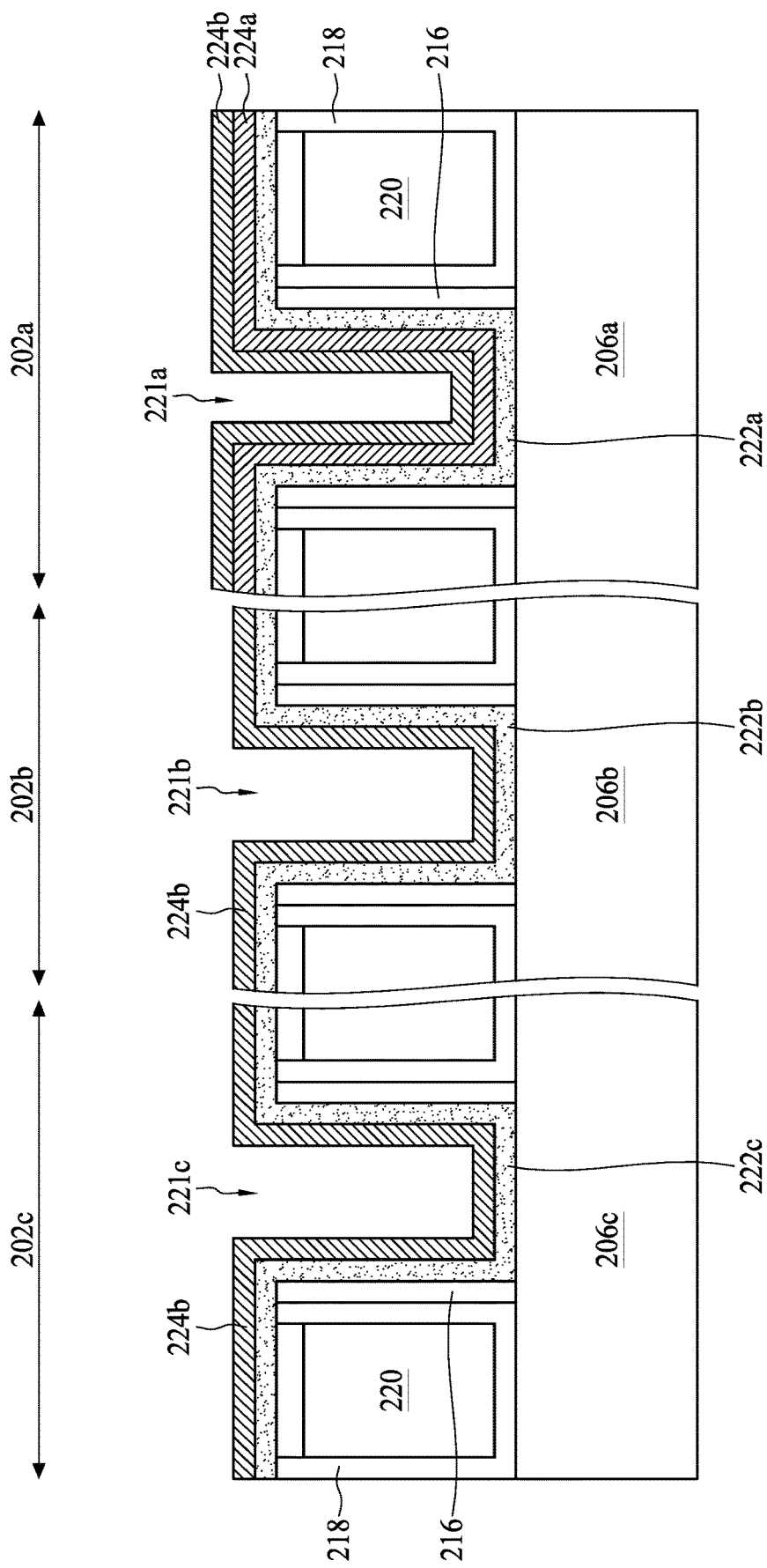
Figure 9:
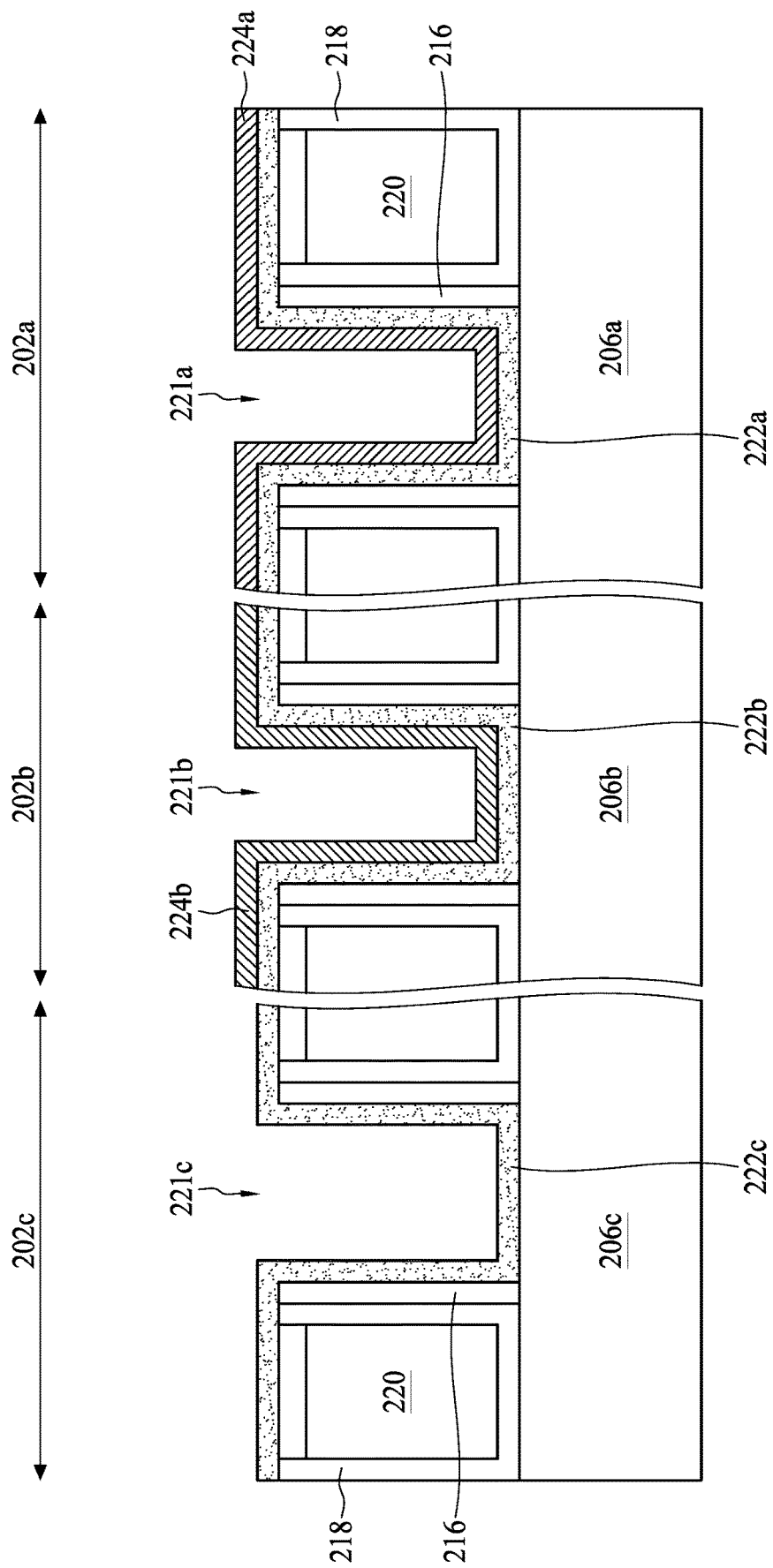
Figure 14:
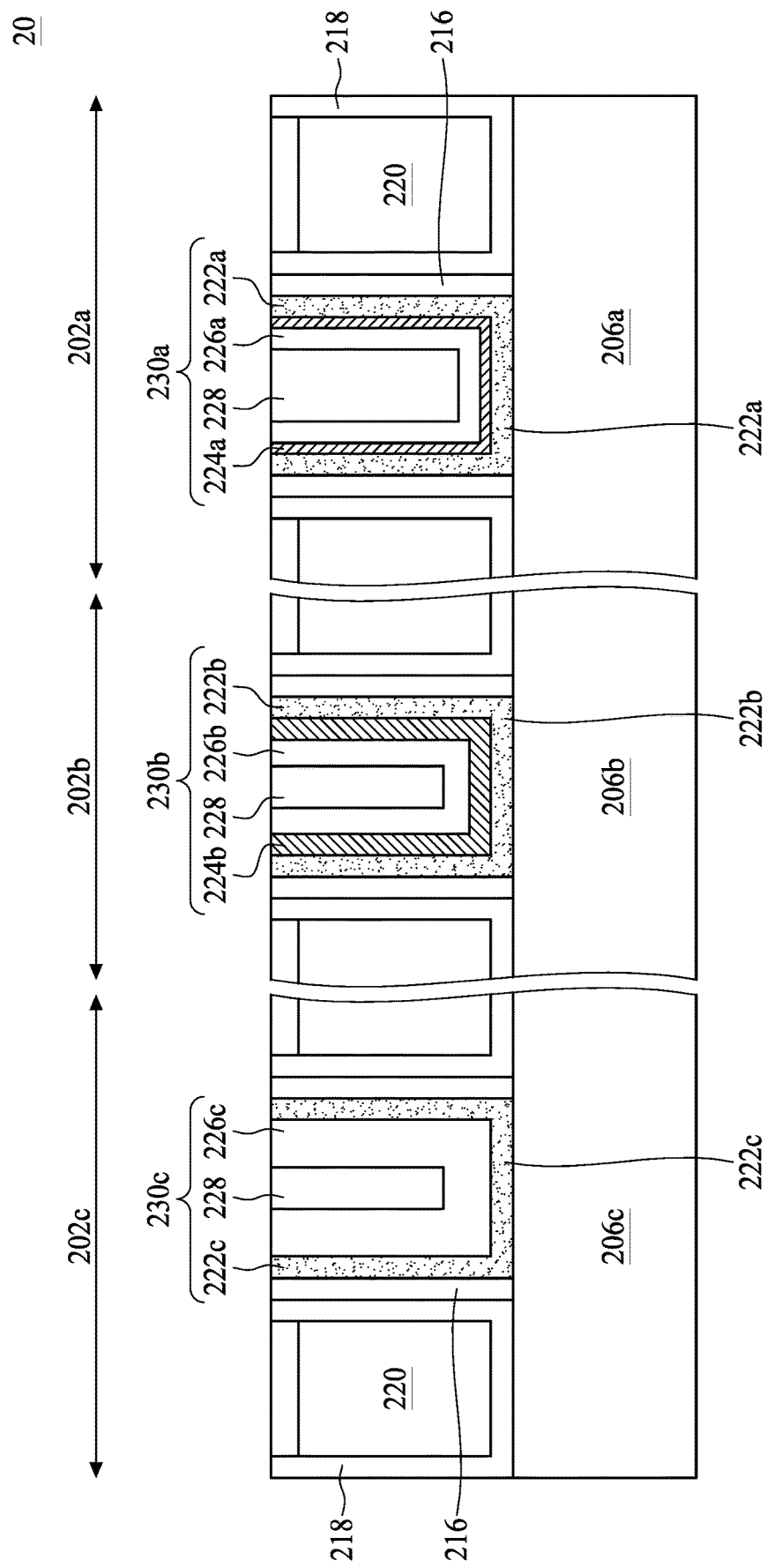
FIG. 14 is a cross-sectional view of a semiconductor structure according to aspects of the present disclosure in one or more embodiments.

Referring to FIGS. 8 and 9, in some embodiments, in operation 105, the method 10 includes forming a second intervening layer 224b over the second high-k gate dielectric layer 222b. A method and parameters for forming the second intervening layer 224b may be similar to those for the first intervening layer 224a; therefore, repeated descriptions of details are omitted for brevity. In some embodiments, the second intervening layer 224b may include silicon, titanium, titanium nitride, tantalum, or tantalum nitride. In some embodiments, a Ti concentration, Ta concentration or a Si concentration in the second intervening layer 224b may be between approximately 5% and approximately 60%, but the disclosure is not limited thereto. In some embodiments, the first intervening layer 224a and the second intervening layer 224b include different materials. For example, the first intervening layer 224a may be a Ta-containing layer, and the second intervening layer 224b may be a Ti-containing layer, but the disclosure is not limited thereto. In some alternative embodiments, the first intervening layer 224a and the second intervening layer 224b may include a same material. A thickness of the second intervening layer 224b may be between approximately 1 nanometer and approximately 10 nanometers, but the disclosure is not limited thereto. In some alternative embodiments, the thickness of the second intervening layer 224b may be less than approximately 1 nanometer. In some embodiments, the thickness of the second intervening layer 224b may be similar to the thickness of the first intervening layer 224a, but the disclosure is not limited thereto. In other embodiments, the thickness of the second intervening layer 224b may be different from the thickness of the first intervening layer 224a. For example, the thickness of the second intervening layer 224b may be greater than the thickness of the first intervening layer 224a, as shown in FIG. 14. In some embodiments, operation 105 further includes forming the second intervening layer 224b conformally over the substrate 200. Therefore, the second intervening layer 224b may cover sidewalls and bottoms of the gate trenches 221a, 221b, top surfaces of the ILD structure 220 and surfaces of the first intervening layer 224a, as shown in FIG. 8.

Referring to FIG. 9, operation 105 further includes removing portions of the second intervening layer 224b. In some embodiments, a patterned masking layer or a patterned protecting layer (not shown) may be formed over the second region 202b, and suitable etching operation(s) may be used to remove portions of the second intervening layer 224b exposed through the patterned masking layer. Consequently, the portions of the second intervening layer 224b are removed from the first gate trench 221a and the third gate trench 221c. In other words, the second intervening layer 22ba remains in the second gate trench 221b and the second region 202b.

Figure 10:
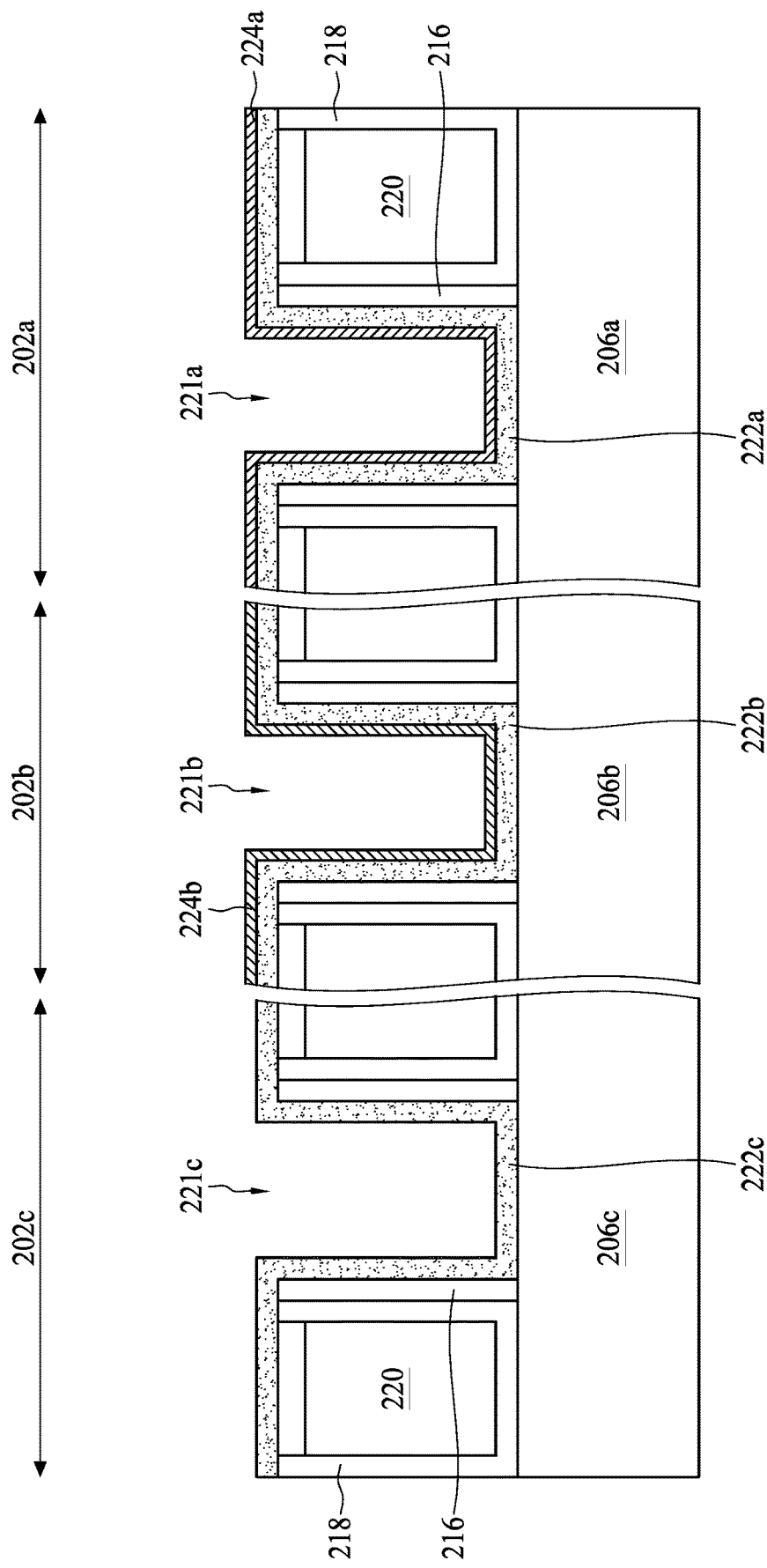

Referring to FIG. 10, in some embodiments, when the first and second intervening layer 224a and 224b are formed with the thickness greater than 1 nanometer, a thickness reduction may be performed. In such embodiments, the thickness of the first intervening layer 224a and the thickness of the second intervening layer 224b are reduced to less than 1 nanometer. In some embodiments, the thickness of the first intervening layer 224a and the thickness of the second intervening layer 224b may be similar after the thickness reduction, as shown in FIG. 10, but the disclosure is not limited thereto. For example, in some other embodiments, the thickness of the second intervening layer 224b may be greater than the thickness of the first intervening layer 224a after the thickness reduction, as shown in FIG. 14. In some embodiments, the thickness reduction may be performed by a wet etching. In other embodiments, the thickness reduction may be performed by a dry etching.

Additionally, an anneal may be performed to repair or to enhance the first and second intervening layer 224a and 224b after the thickness reduction. In some embodiments, the anneal may be performed using a furnace at a temperature between approximately 300° C. and approximately 600° C., and in a duration between approximately 1 minute to approximately 1 day. In some embodiments, the anneal may be performing using a rapid thermal anneal (RTA) at a temperature between approximately 400° C. and approximately 1000° C., and in a duration between approximately 0.1 second to approximately 100 seconds. In other embodiments, the anneal may be performed using flash or laser anneal.

Figure 11:
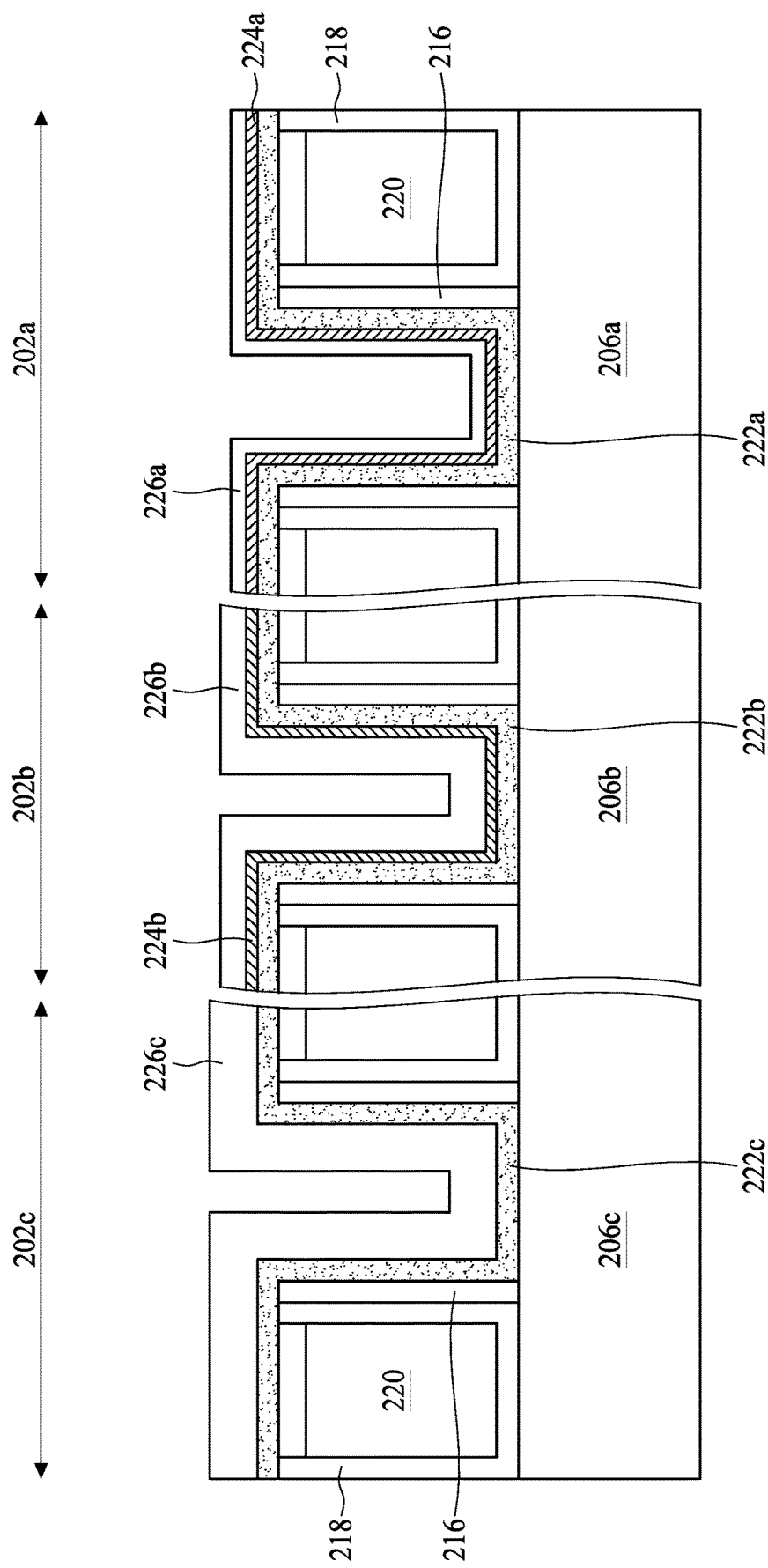

Referring to FIG. 11, in some embodiments, in operation 106, the method 10 includes simultaneously forming a first work function metal layer 226a over the first intervening layer 224a, a second work function metal layer 226b over the second intervening layer 224b, and a third work function metal layer 226c over the third high-k gate dielectric layer 222c. In some embodiments, the first work function metal layer 226a may be in direct contact with the first intervening layer 224a, and the second work function metal layer 226b may be in direct contact with the second intervening layer 224b. In contrast with the first and second work function metal layers 226a and 226b, the third work function metal layer 226c may be in direct contact with the third high-k gate dielectric layer 222c. The first, second and third work function metal layers 226a, 226b and 226c include a same material. For example, the work function metal layers 226a, 226b and 226c may include n-type work function metal layers. Further, the work function metal layers 226a, 226b and 226c may include same n-type metal materials. In some embodiments, the work function metal layers 226a, 226b and 226c may be n-type work function metal layers including aluminum (Al).

A thickness of the work function metal layers 226a, 226b and 226c may respectively between approximately 1 nanometer and approximately 10 nanometers, but the disclosure is not limited thereto. It is known that layer growth is related to an underlying surface condition. In some embodiments, even though the work function metal layers 226a, 226b and 226c include the same material, they may obtain different thicknesses due to the different underlying surface conditions. In other words, the first intervening layer 224a, the second intervening layer 224b and the third high-k gate dielectric layer 222c may provide different interference abilities to the overlaying layer growth. In some embodiments, a thickness of the third work function metal layer 226c, which is formed on the third high-k gate dielectric layer 222c, is greater than a thickness of the second work function metal layer 226b, which is formed on the second intervening layer 224b (i.e., a Ti-containing layer). Further, the thickness of the second work function metal layer 226b is greater than a thickness of the first work function metal layer 226a, which is formed on the first intervening layer 224a (i.e., a Ta-containing layer). In other words, by providing different underlying surface conditions, the method may simultaneously form work function metal layers 226a, 226b and 226c of the same material but different thicknesses, as shown in FIG. 11.

Figure 12:
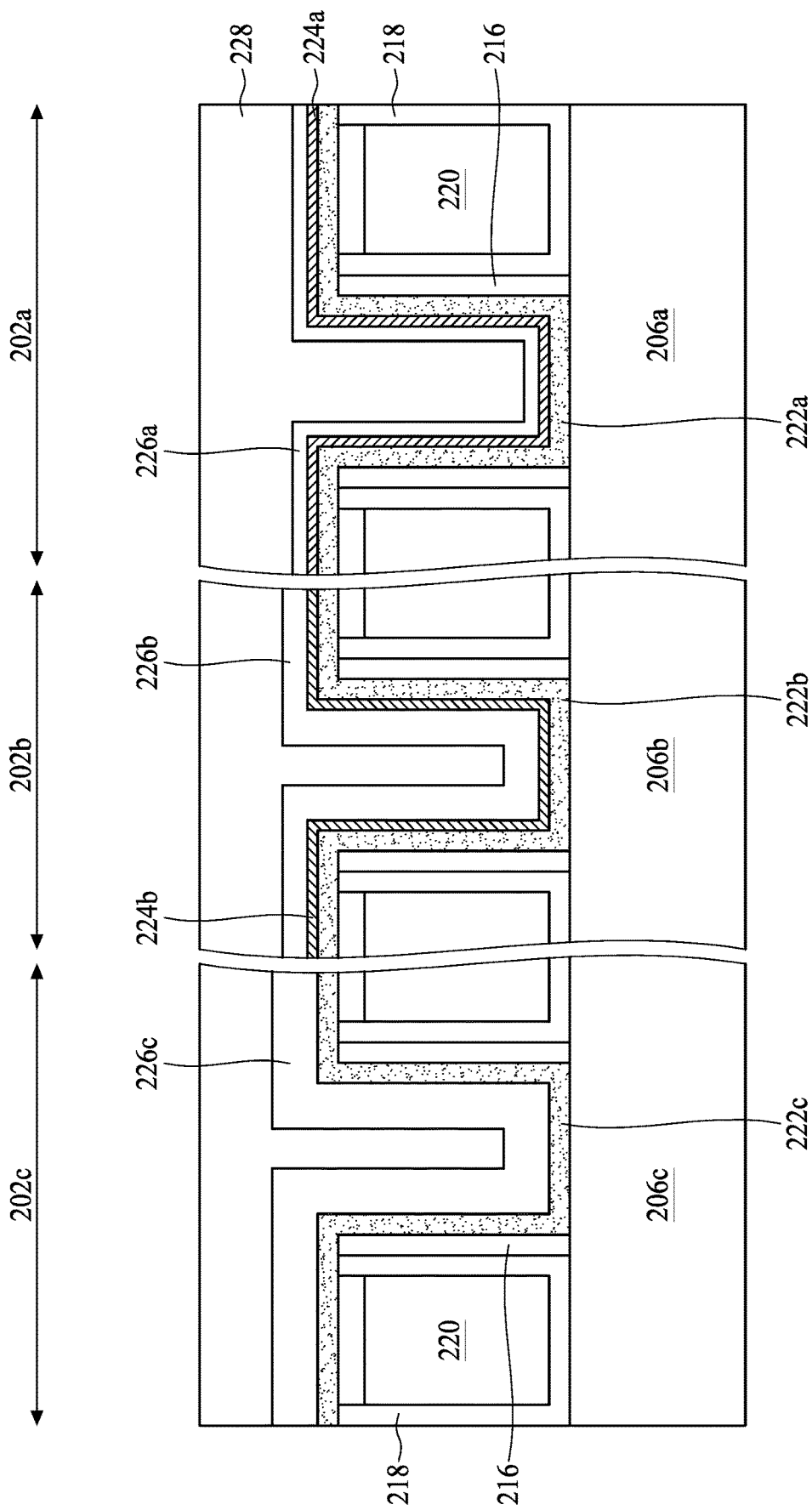

Referring to FIG. 12, in some embodiments, a gap-filling metal layer 228 is formed to fill the first gate trench 221a, the second gate trench 221b and the third gate trench 221c. In some embodiments, the gap-filling metal layer 228 can include conductive material such as Al, Cu, AlCu, or W, but is not limited to the above-mentioned materials.

Figure 13:
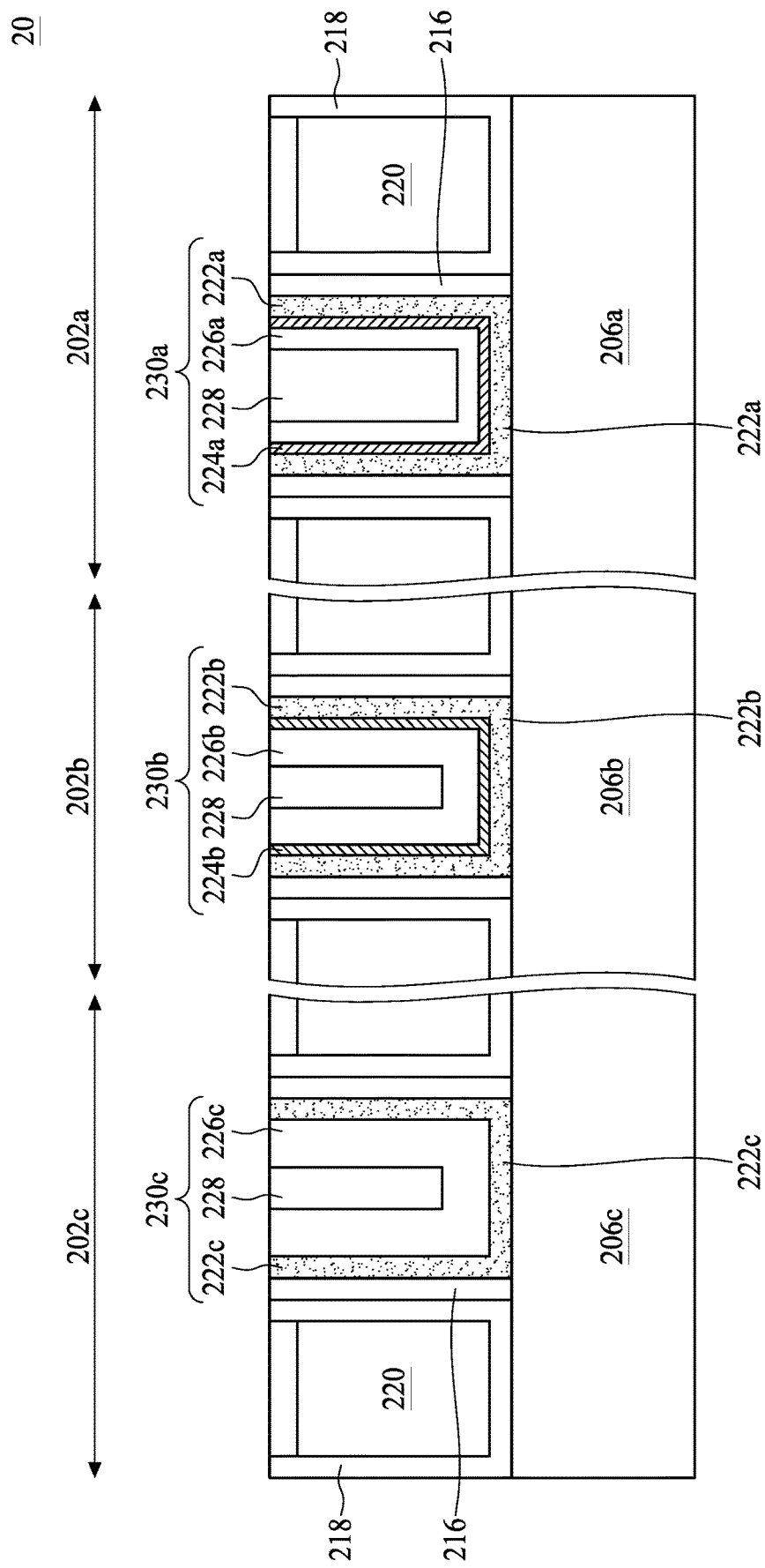

Referring to FIG. 13, in some embodiments, a planarization operation such as a CMP may be performed to remove superfluous layers. Accordingly, portions of the high-k gate dielectric layers 222a, 222b and 222c, portions of the intervening layers 224a and 224b, portions of the work function metal layers 226a, 226b and 226c, and portions of the gap-filling layer 228 are removed. Thus, a first metal gate structure 230a is formed in the first FET device 210a in the first region 202a, a second metal gate structure 230b is formed in the second FET device 210b in the second region 202b, and a third metal gate structure 230c is formed in the third FET device 210c in the third region 202c. In some embodiments, atop surface of the first metal gate structure 230a, a top surface of the second metal gate structure 230b, a top surface of the third metal gate structure 230c, and top surfaces of the ILD structure 220 may be aligned with each other (i.e., the top surfaces may be co-planar).

Accordingly, a semiconductor structure 20 is obtained as shown in in FIG. 13. The semiconductor structure 20 includes the first FET device 210a, the second FET device 210b and the third FET device 210c. As mentioned above, the FET devices 210a, 210b and 210c may be FinFET devices. Therefore, the first FET device 210a includes the first metal gate structure 230a over the first fin structure 206a, the second FET device 210b includes the second metal gate structure 230b over the second fin structure 206b and the third FET device 210c include the third metal gate structure 230c over the third fin structure 206c. The first metal gate structure 230a includes the first high-k gate dielectric layer 222a, the first work function metal layer 226a over the first high-k gate dielectric layer 222a, and the first intervening layer 224a between the first work function metal layer 226a and the first high-k gate dielectric layer 222a. The second metal gate structure 230b includes the second high-k gate dielectric layer 222b, the second work function metal layer 226b over the second high-k gate dielectric layer 222b and the second intervening layer 224b between the second high-k gate dielectric layer 222b and the second work function metal layer 226b. The third metal gate structure 230c includes the third high-k gate dielectric layer 222c and the third work function metal layer 226c over the third high-k gate dielectric layer 222c. As mentioned above, the first, second and third work function metal layers 226a, 226b and 226c include the same materials. For example, the first, second and third work function metal layers 226a, 226b and 226c may include Al-containing n-type work function metal layers.

In some embodiments, it is found that Al may diffuse from the work function metal layers 226a, 226b and 226c. As shown in FIG. 13, because the thicknesses of the work function metal layers 226a, 226b and 226c are different from each other, volumes of the work function metal layers 226a, 226b and 226c are different from each other. As the thickness of the first work function metal layer 226a is less than the thickness of the second work function metal layer 226b, and the thickness of the second work function metal layer 226b is less than the thickness of the third work function metal layer 226c, the volume of the first work function metal layer 226a is less than the volume of the second work function metal layer 226b, and the volume of the second work function metal layer 226b is less than the volume of the third work function metal layer 226c. Thus, the first work function metal layer 226a provides less Al than that of the second work function metal layer 226b, and the second work function metal layer 226b provides less Al than that of the third work function metal layer 226c. Consequently, Al diffusion into the first high-k gate dielectric layer 222a is less than that into the second high-k gate dielectric layer 222b, and Al diffusion into the second high-k gate dielectric layer 222b is less than that into the third high-k gate dielectric layer 222c. In some embodiments, the high-k gate dielectric layers 222a, 222b and 222c may include the same metal material such as Al, but a metal concentration (i.e., the Al concentration) of the first high-k gate dielectric layer 222a is less than a metal concentration (i.e., the Al concentration) of the second high-k gate dielectric layer 222b, and the metal concentration (i.e., the Al concentration) of the second high-k gate dielectric layer 222b is less than a metal concentration (i.e., the Al concentration) of the third high-k gate dielectric layer 222c.

It should be noted that the third high-k gate dielectric layer 222c with greater Al concentration is suitable for an LV device, the first high-k gate dielectric layer 222a with a lower Al concentration is suitable for an HV device, and the second high-k gate dielectric layer 222b with the medium Al concentration is suitable an MV device. Accordingly, the semiconductor structure 20 is a multiple-Vt structures suitable for device design.

Accordingly, the method 10 includes forming the first and second intervening layers 224a and 224b with the thickness less than 1 nanometer. Thus the intervening layers 224a and 224b are able to interfere the Al diffusion with a relatively thinner profile. Further, such thin intervening layers 224a and 224b render less impact on gap filling. In short, the method 10 provides the intervening layers 224a and 224b for forming work function metal layers with different thicknesses and different Al supplies in order to meet multiple-Vt structure requirements with competitive gap-filling ability.

FIG. 14 is a cross-sectional view of a semiconductor structure according to aspects of the present disclosure in one or more embodiments. It should be noted that same elements in FIGS. 2 to 13 and FIG. 14 are indicated by same numerals, and can include a same material. Thus, repeated descriptions of details are omitted for brevity. In some embodiments, the first intervening layer 224a and the second intervening layer 224b may include different materials and different thicknesses. For example, the first intervening layer 224a may be a Ta-containing layer, and the second intervening layer 224b may be a Ti-containing layer. In such embodiments, the thickness of the second intervening layer 224b may be greater than the thickness of the thickness of the first intervening layer 224a.

Figure 15:
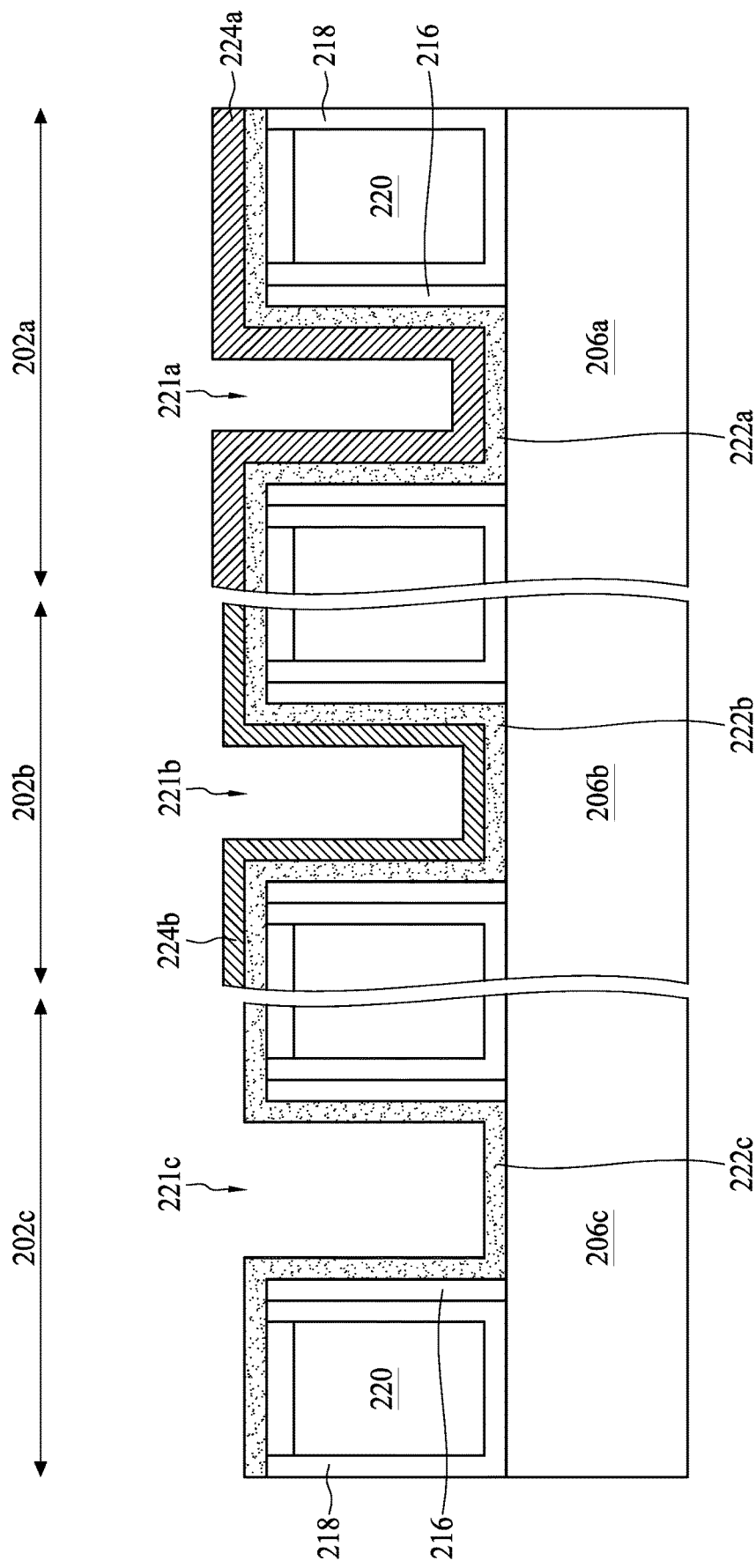
FIG. 15 shows cross-sectional views taken along lines X1-X1', X2-X2' and X3-X3' of FIG. 2, respectively.
Figure 16:
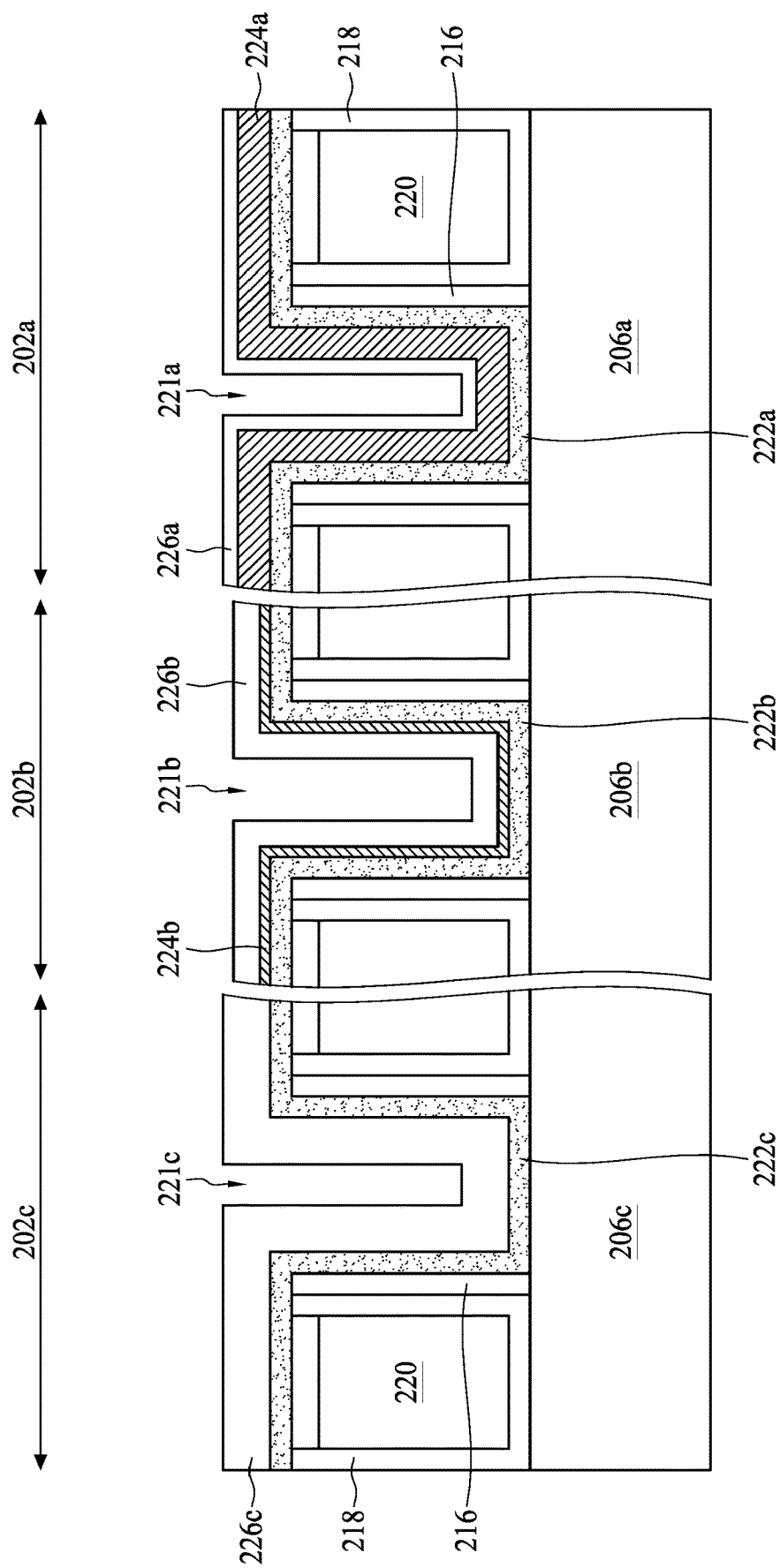
FIGS. 16 to 18 are schematic drawings illustrating the semiconductor structure at various fabrication stages subsequent to the stage shown in FIG. 15 according to aspects of the present disclosure in one or more embodiments.
Figure 17:
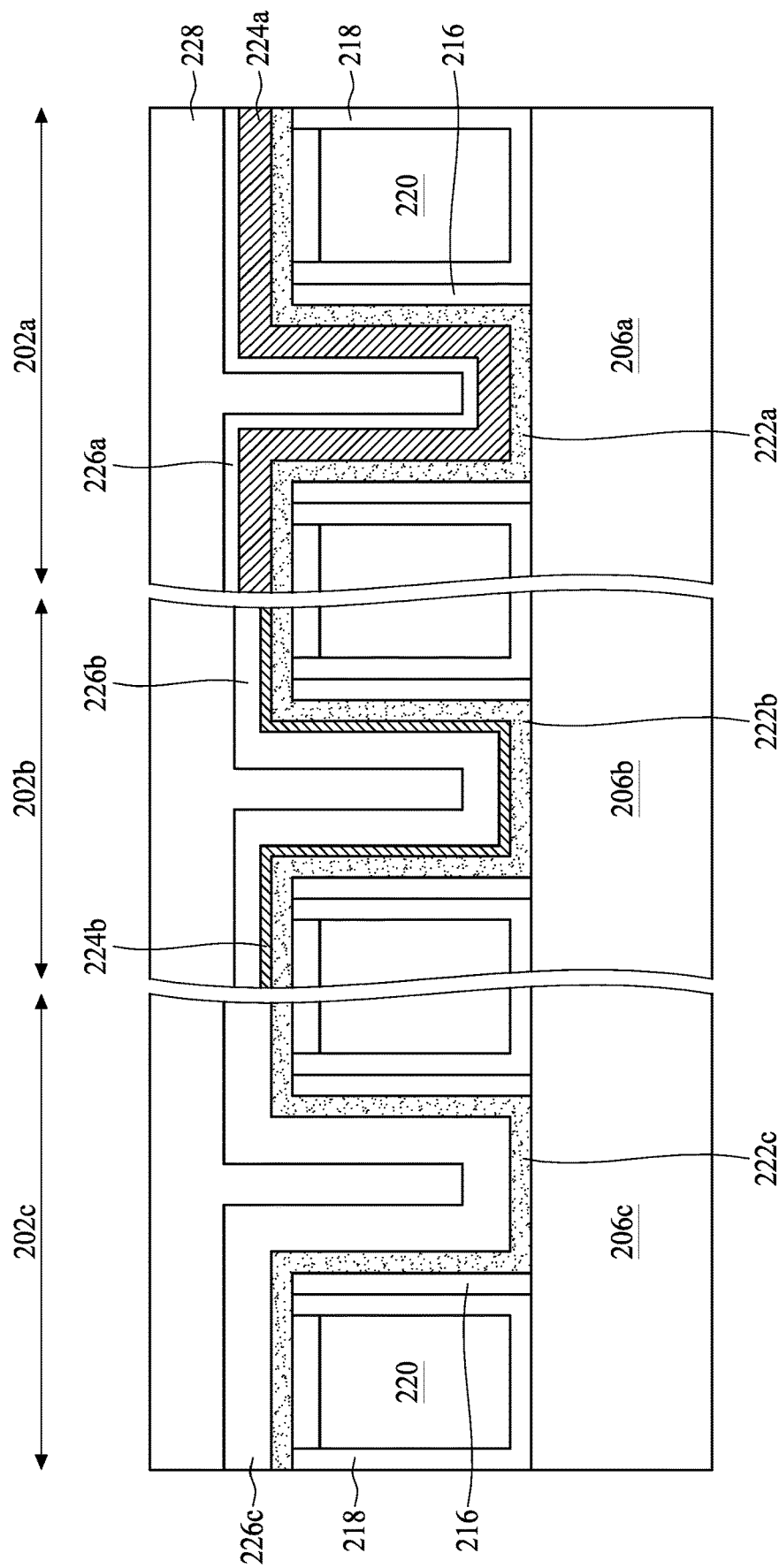
Figure 18:
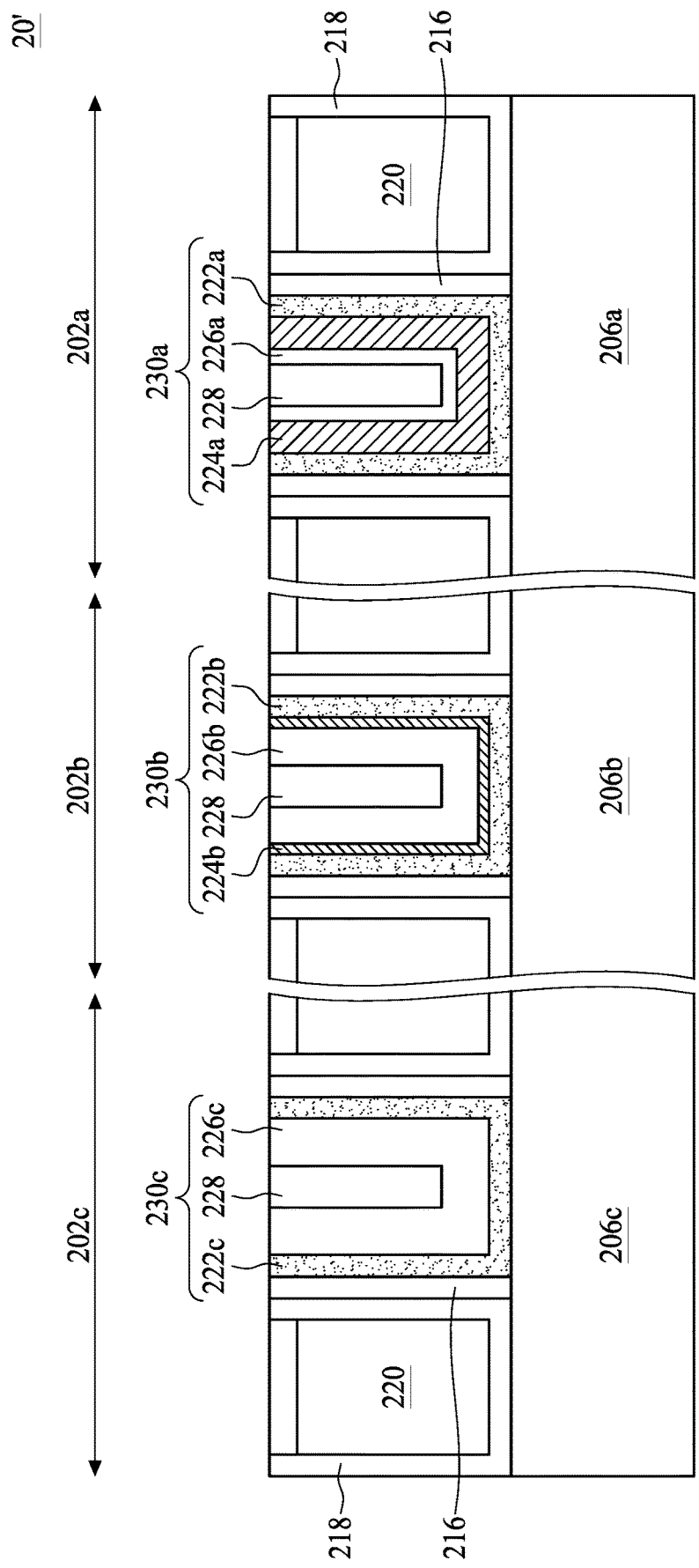

FIG. 15 shows cross-sectional views taken along lines X1-X1', X2-X2' and X3-X3' of FIG. 2, respectively, and FIGS. 16 to 18 are schematic drawings illustrating the semiconductor structure at various fabrication stages subsequent to the stage shown in FIG. 15 according to aspects of the present disclosure in one or more embodiments. It should be noted that same elements in FIGS. 2 to 13 and FIGS. 15 to 18 are indicated by same numerals, and can include a same material. Thus, repeated descriptions of details are omitted for brevity.

In some embodiments, in operation 101, the method 10 includes forming a first FET device 210a, a second FET device 210b and a third FET device 210c over a substrate 200. The devices 210a, 210b and 210c may be planar transistors or multi-gate transistors, such as FinFETs. The FinFET devices 210a, 210b and 210c are similar to those described above; therefore, repeated descriptions of details are omitted for brevity. As mentioned above, a CESL 218 may be formed to cover the FinFET devices 210a, 210b, and 210c over the substrate 200. Subsequently, an ILD structure 220 may be formed on the CESL 218. A polishing process may be performed on the ILD structure 220 and the CESL 218 to expose top surfaces of the sacrificial gate structures 212a, 212b and 212c.

Referring to FIG. 15, in some embodiments, in operation 102, the method 10 includes forming a first gate trench 221a in the first FET device 210a, a second gate trench 221b in the second FET device 210b, and a third gate trench 221c in the third FET device 210c. As mentioned above, a removal of the dielectric layer may be performed depending on different process or product requirements. In some embodiments, the first fin structure 206a may be exposed through the first gate trench 221a, the second fin structure 206b may be exposed through the second gate trench 221b, and the third fin structure 206c may be exposed through the third gate trench 221c.

In some embodiments, in operation 103, the method 10 includes forming a first high-k gate dielectric layer 222a in the first gate trench 221a, a second high-k gate dielectric layer 222b in the second gate trench 221b, and a third high-k gate dielectric layer 222c in the third gate trench 221c. In some embodiments, an IL layer may be formed prior to the forming of the high-k gate dielectric layers 222a, 222b and 222c, though not shown. In some embodiments, the high-k gate dielectric layers 222a, 222b and 222c may be simultaneously and conformally formed in the gate trenches 221a, 221b and 221c, respectively. As mentioned above, the high-k gate dielectric layers 222a, 222b and 222c may include the same material and same thickness.

In some embodiments, in operation 104, the method 10 includes forming a first intervening layer 224a on the first high-k gate dielectric layer 222a. The forming of the first intervening layer 224a may be similar to those described above; therefore, repeated descriptions of details are omitted for brevity. In some embodiments, in operation 105, the method 10 includes forming a second intervening layer 224b on the second high-k gate dielectric layer 222b. The forming of the second intervening layer 224b may be similar to those described above; therefore, repeated descriptions of details are omitted for brevity.

In some embodiments, the first intervening layer 224a and the second intervening layer 224b include a same material. In some alternative embodiments, the first intervening layer 224a and the second intervening layer 224b may include different materials. For example, the first intervening layer 224a may be a Ta-containing layer, and the second intervening layer 224b may be a Ti-containing layer, but the disclosure is not limited thereto. In such embodiments, a thickness of the first intervening layer 224a is different from a thickness of the second intervening layer 224b. For example, the thickness of the first intervening layer 224a is greater than the thickness of the second intervening layer 224b, as shown in FIG. 15.

Referring to FIG. 16, in some embodiments, in operation 106, the method 10 includes simultaneously forming a first work function metal layer 226a over the first intervening layer 224a, a second work function metal layer 226b over the second intervening dielectric layer 224b, and a third work function metal layer 226c over the third high-k gate dielectric layer 222c. As mentioned above, the first work function metal layer 226a may be in direct contact with the first intervening layer 224a, and the second work function metal layer 226b may be in direct contact with the second intervening layer 224b. In contrast with the first and second work function metal layers 226a and 226b, the third work function metal layer 226c may be in direct contact with the third high-k gate dielectric layer 222c. The first, second and third work function metal layers 226a, 226b and 226c include a same material. For example, the work function metal layers 226a, 226b and 226c may include same n-type metal materials. In some embodiments, the work function metal layers 226a, 226b and 226c may be n-type work function metal layers including aluminum. A thickness of the work function metal layers 226a, 226b and 226c may respectively between approximately 1 nanometer and approximately 10 nanometers, but the disclosure is not limited thereto. As mentioned above, the third high-k gate dielectric layer 222c, the second intervening layer 224b and the first intervening layer 224a provides different influences to the overlaying layer growth. In some embodiments, even though the work function metal layers 226a, 226b and 226c include the same material, they may obtain different thicknesses due to the different underlying surface conditions. In some embodiments, a thickness of the third work function metal layer 226c, which is formed on the third high-k gate dielectric layer 222c, is greater than a thickness of the second work function metal layer 226b, which is formed on the second intervening layer 224b (i.e., a Ti-containing layer). Further, the thickness of the second work function metal layer 226b is greater than a thickness of the first work function metal layer 226a, which is formed on the first intervening layer 224a (i.e., a Ta-containing layer). In other words, by providing different underlying surface conditions, the method may simultaneously form work function metal layers 226a, 226b and 226c of the same material but different thicknesses, as shown in FIG. 16.

Referring to FIG. 17, in some embodiments, a gap-filling metal layer 228 is formed to fill the first gate trench 221a, the second gate trench 221b and the third gate trench 221c.

Referring to FIG. 18, in some embodiments, a planarization operation such as a CMP may be performed to remove superfluous layers. Accordingly, a first metal gate structure 230a is formed in the first FET device 210a in the first region 202a, a second metal gate structure 230b is formed in the second FET device 210b in the second region 202b, and a third metal gate structure 230c is formed in the third FET device 210c in the third region 202c. In some embodiments, a top surface of the first metal gate structure 230a, a top surface of the second metal gate structure 230b, a top surface of the third metal gate structure 230c, and top surfaces of the ILD structure 220 may be aligned with each other (i.e., the top surfaces may be co-planar).

Accordingly, a semiconductor structure 20' is obtained as shown in FIG. 18. The semiconductor structure 20' includes the first FET device 210a, the second FET device 210b and the third FET device 210c. As mentioned above, the FET devices 210a, 210b and 210c may all be FinFET devices. Therefore, the first FET device 210a includes the first metal gate structure 230a over the first fin structure 206a, the second FET device 210b includes the second metal gate structure 230b over the second fin structure 206b, and the third FET device 210c includes the third metal gate structure 230c over the third fin structure 206c. The first metal gate structure 230a includes the first high-k gate dielectric layer 222a, the first work function metal layer 226a, and the first intervening layer 224a between the first work function metal layer 226a and the first high-k gate dielectric layer 222a. The second metal gate structure 230b includes the second high-k gate dielectric layer 222b, the second work function metal layer 226b, and the second intervening layer 224b between the second high-k gate dielectric layer 222b and the second work function metal layer 226b. The third metal gate structure 230c includes the third high-k gate dielectric layer 222c and the third work function metal layer 226c. As mentioned above, the first, second and third work function metal layers 226a, 226b and 226c include the same materials. For example, the first, second and third work function metal layers 226a, 226b and 226c may include Al-containing n-type work function metal layers.

As mentioned above, it is found that Al may diffuse from the work function metal layers 226a, 226b and 226c. As shown in FIG. 18, because the thickness of the first work function metal layer 226a is less than the thickness of the second work function metal layer 226b, and the thickness of the second work function metal layer 226b is less than the thickness of the third work function metal layer 226c, the first work function metal layer 226a provides less Al than that of the second work function metal layer 226b, and the second work function metal layer 226b provides less Al than that of the third work function metal layer 226c. Consequently, Al diffusion into the first high-k gate dielectric layer 222a is less than that into the second high-k gate dielectric layer 222b, and Al diffusion into the second high-k gate dielectric layer 222b is less than that into the third high-k gate dielectric layer 222c.

Further, because the third work function metal layer 226b is in direct contact with the third high-k gate dielectric layer 222c, Al diffusion encounters less obstacle. In the first metal gate structure 210a and the second metal gate structure 210b, the first and second intervening layers 224a and 224b may further serve as Al diffusion barriers. In some embodiments, the first intervening layer 224a, which has thickness greater than that of the second intervening layer 224b, serve as a stronger barrier than the second intervening layer 224b. Accordingly, Al diffusion in the third metal gate structure 210c is greater than that in the second metal gate structure 210b, and Al diffusion in the second metal gate structure 210b is greater than that in the first metal gate structure 210a.

In some embodiments, the high-k gate dielectric layers 222a, 222b and 222c may include the same metal material such as Al, but a metal concentration (i.e., the Al concentration) of the first high-k gate dielectric layer 222a is less than a metal concentration (i.e., the Al concentration) of the second high-k gate dielectric layer 222b, and the metal concentration (i.e., the Al concentration) of the second high-k gate dielectric layer 222b is less than a metal concentration (i.e., the Al concentration) of the third high-k gate dielectric layer 222c.

It should be noted that the third high-k gate dielectric layer 222c with high Al concentration is suitable for an LV device, the first high-k gate dielectric layer 222a with low Al concentration is suitable for an HV device, and the second high-k gate dielectric layer 222b with medium Al concentration is suitable for an MV device. Accordingly, the semiconductor structure 20' is a multiple-Vt structure suitable for device design.

Accordingly, the method 10 includes forming the first and second intervening layers 224a and 224b with the thickness less than 1 nanometer. Thus the intervening layers 224a and 224b are able to interfere the Al diffusion with a relatively thinner profile. Further, such thin intervening layers 224a and 224b render less impact on gap filling. In some embodiments, the first intervening layer 224a and the second intervening layer 224b may further serve as barrier layers with different barrier abilities. In short, the method 10 provides the intervening layers 224a and 224b for forming work function metal layers with different thicknesses in order to meet multiple-Vt structure requirements with competitive gap-filling ability.

In summary, the present disclosure provides a method for forming a semiconductor structure. The method may be integrated into an HKMG process. The method may also be integrated with formation of a planar device or a non-planar device. In some embodiments, the method for forming the semiconductor structure includes the intervening layers of different materials and/or different thicknesses for forming work function metal layers with different thicknesses. Thus, Al diffusion amount may be different due to the work function metal layers with different thicknesses. Accordingly, high-k gate dielectric layers with different metal concentration may be obtained, thereby helping the semiconductor structure to meet multiple-Vt structure requirements.

Some embodiments of the present disclosure provide a semiconductor structure. The semiconductor structure includes a first metal gate structure and a second metal gate structure. The first metal gate structure includes a first high-k gate dielectric layer, a first work function metal layer over the first high-k gate dielectric layer, and a first intervening layer between the first high-k gate dielectric layer and the first work function metal layer. The second metal gate structure includes a second high-k gate dielectric layer and a second work function metal layer over the second high-k gate dielectric layer. The first work function metal layer and the second work function metal layer include a same material. A thickness of the first work function metal layer is less than a thickness of the second work function metal layer.

Some embodiments of the present disclosure provide a semiconductor structure. The semiconductor structure includes a first metal gate structure and a second metal gate structure. The first metal gate structure includes a first high-k gate dielectric layer, a first work function metal layer over the first high-k gate dielectric layer, and a first intervening layer between the first high-k gate dielectric layer and the first work function metal layer. The second metal gate structure includes a second high-k gate dielectric layer, a second work function metal layer over the second high-k gate dielectric layer, and a second intervening layer between the second high-k gate dielectric layer and the second work function metal layer. The first work function metal layer and the second work function metal layer include a same material, and a thickness of the first work function metal layer is less than a thickness of the second work function metal layer.

Some embodiments of the present disclosure provide a method for forming a semiconductor structure. The method includes following operations. A first FET device, a second FET device and a third FET device are formed over a substrate. A first gate trench is formed in the first FET device, a second gate trench is formed in the second FET device, and a third gate trench is formed in the third FET device. A first high-k gate dielectric layer is formed in the first gate trench, a second high-k gate dielectric layer is formed in the second gate trench, and a third high-k gate dielectric layer is formed in the third gate trench. A first intervening layer is formed over the first high-k gate dielectric layer. A second intervening layer is formed over the second high-k gate dielectric layer. A first work function metal layer is formed over the first intervening layer, a second work function metal layer is formed over the second intervening layer, and a third work function metal layer is formed over the third high-k gate dielectric layer, simultaneously. The first work function metal layer, the second work function metal layer, and the third work function metal layer include a same material. A thickness of the first work function metal layer is less than a thickness of the second work function metal layer, and the thickness of the second work function metal layer is less than a thickness of the third work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a first metal gate structure comprising:
   a first high-k gate dielectric layer;
   a first work function metal layer over the first high-k gate dielectric layer; and
   a first intervening layer between the first high-k gate dielectric layer and the first work function metal layer;
a second metal gate structure comprising:
   a second high-k gate dielectric layer; and
   a second work function metal layer over and in direct contact with the second high-k gate dielectric layer and
a third metal gate structure comprising:
   a third high-k gate dielectric layer;
   a third work function metal layer over the third high-k gate dielectric layer; and
   a second intervening layer between the third high-k gate dielectric layer and the third work function metal layer,
wherein the first work function metal layer, the second work function metal layer and the third word function metal layer comprise a same material, and a thickness of the first work function metal layer is less than a thickness of the second work function metal layer,
wherein the first intervening layer and the second intervening layer comprise different materials and different thicknesses.

2. The semiconductor structure of claim 1, where the first high-k gate dielectric layer and the second high-k gate dielectric layer comprise a same metal material, the first high-k gate dielectric layer has a first metal concentration, the second high-k gate dielectric layer has a second metal concentration, and the first metal concentration is less than the second metal concentration.

3. The semiconductor structure of claim 1, wherein the first intervening layer comprises silicon, titanium, titanium nitride, tantalum or tantalum nitride.

4. The semiconductor structure of claim 1, wherein a thickness of the first intervening layer is less than 1 nanometer.

5. The semiconductor structure of claim 1, further comprising:
a first fin structure, wherein the first metal gate structure is disposed over the first fin structure; and
a second fin structure, wherein the second metal gate structure is disposed over the second fin structure.

6. The semiconductor structure of claim 1,
wherein a thickness of the third work function metal layer is greater than the thickness of the first work function metal layer, and is less than the thickness of the second work function metal layer.

7. A semiconductor structure, comprising:
a first metal gate structure comprising:
   a first high-k gate dielectric layer;
   a first work function metal layer over the first high-k gate dielectric layer; and
   a first intervening layer between the first high-k gate dielectric layer and the first work function metal layer; and
a second metal gate structure comprising:

a second high-k gate dielectric layer;
a second work function metal layer over the second high-k gate dielectric layer; and
a second intervening layer between the second high-k gate dielectric layer and the second work function metal layer,
wherein the first intervening layer and the second intervening layer comprise silicon (Si), titanium (Ti), titanium nitride (TiN), tantalum (Ta) or tantalum nitride (TaN), the first intervening layer and the second intervening layer comprise different materials, a thickness of the first intervening layer and a thickness of the second intervening layer are similar, the first work function metal layer and the second work function metal layer comprise a same material, and a thickness of the first work function metal layer is less than a thickness of the second work function metal layer.

8. The semiconductor structure of claim 7, wherein the first high-k gate dielectric layer and the second high-k gate dielectric layer comprise a same metal material, the first high-k gate dielectric layer has a first metal concentration, the second high-k gate dielectric layer has a second metal concentration, and the first metal concentration is less than the second metal concentration.

9. The semiconductor structure of claim 8, further comprising a third metal gate structure, wherein the third metal gate structure comprises:
a third high-k gate dielectric layer comprising the metal material; and
a third work function metal layer over the third high-k gate dielectric layer,
wherein the third work function metal layer comprises a material the same with the first and the second work function metal layers, a thickness of the third work function metal is greater than the thickness of the second work function metal layer, the third high-k gate dielectric layer comprises the metal material, and the third high-k gate dielectric layer has a third metal concentration greater than the second metal concentration.

10. The semiconductor structure of claim 7, wherein a Ti concentration, a Ta concentration or a Si concentration in the first intervening layer is between approximately 5% and approximately 60%.

11. The semiconductor structure of claim 7, wherein a Ti concentration, a Ta concentration or a Si concentration in the second intervening layer is between approximately 5% and approximately 60%.

12. The semiconductor structure of claim 8, wherein the first high-k gate dielectric layer, the second high-k gate dielectric layer, the first work function metal layer and the second work function metal layer comprise a same metal material.

13. The semiconductor structure of claim 12, wherein the metal material comprise aluminum.

14. A method for forming a semiconductor structure comprising:
forming a first field effect transistor (FET) device, a second FET device and a third FET device over a substrate;
forming a first gate trench in the first FET device, a second gate trench in the second FET device, and a third gate trench in the third FET device;
forming a first high-k gate dielectric layer in the first gate trench, a second high-k gate dielectric layer in the second gate trench, and a third high-k gate dielectric layer in the third gate trench;
forming a first intervening layer over the first high-k gate dielectric layer, wherein the first intervening layer comprises silicon;
forming a second intervening layer over the second high-k gate dielectric layer, wherein the second intervening layer comprises silicon; and
simultaneously forming a first work function metal layer over and directly contacting with the first intervening layer, a second work function metal layer over and directly contacting with the second intervening layer, and a third work function metal layer over the third high-k gate dielectric layer,
wherein the third gate trench is free of the first intervening layer and the second intervening layer, the first work function metal layer, the second work function metal layer and the third work function metal layer comprise a same material, a thickness of the first work function metal layer is less than a thickness of the second work function metal layer, and the thickness of the second work function metal layer is less than a thickness of the third work function metal layer.

15. The method of claim 14, wherein the first high-k gate dielectric layer, the second high-k gate dielectric layer and the third high-k gate dielectric layer comprise a same metal material, the first high-k gate dielectric layer has a first metal concentration, the second high-k gate dielectric layer has a second metal concentration, the third high-k gate dielectric layer has a third metal concentration, the first metal concentration is less than the second metal concentration, and the second metal concentration is less than the third metal concentration.

16. The method of claim 14, wherein the forming of the first intervening layer and the forming of the second intervening layer further comprise:
forming the first intervening layer over the substrate;
removing the first intervening layer from the second gate trench and the third gate trench;
forming the second intervening layer over the substrate; and
removing the second intervening layer from the first gate trench and the third gate trench.

17. The method of claim 14, further comprising reducing a thickness of the first intervening layer and a thickness of the second intervening layer.

18. The method of claim 17, wherein the thickness of the first intervening layer and the thickness of the second intervening layer are reduced to less than 1 nanometer.

19. The method of claim 17, wherein the thickness of the first intervening layer is equal to or less than the thickness of the second intervening layer.

20. The method of claim 14, wherein the first intervening layer and the second intervening layer comprise different materials.

* * * * *